(12) United States Patent
Pagnanelli

(10) Patent No.: US 11,949,386 B2
(45) Date of Patent: Apr. 2, 2024

(54) DISTRIBUTED CONVERSION OF DIGITAL DATA TO RADIO FREQUENCY

(71) Applicant: Christopher Pagnanelli, Huntington Beach,, CA (US)

(72) Inventor: Christopher Pagnanelli, Huntington Beach,, CA (US)

(73) Assignee: Pagnanelli Family Trust, Huntington Beach, CA (US)

(*) Notice: Subject to any disclaimer, the term of this patent is extended or adjusted under 35 U.S.C. 154(b) by 440 days.

(21) Appl. No.: 17/443,473

(22) Filed: Jul. 27, 2021

(65) Prior Publication Data

US 2022/0077826 A1    Mar. 10, 2022

Related U.S. Application Data

(60) Provisional application No. 63/171,929, filed on Apr. 7, 2021, provisional application No. 62/706,797, filed on Sep. 10, 2020.

(51) Int. Cl.
| | | |
|---|---|---|
| G06F 7/42 | (2006.01) | |
| H03F 1/02 | (2006.01) | |
| H03F 1/56 | (2006.01) | |
| H03F 3/195 | (2006.01) | |
| H03F 3/217 | (2006.01) | |
| H03F 3/24 | (2006.01) | |

(52) U.S. Cl.
CPC .......... *H03F 1/0288* (2013.01); *H03F 1/565* (2013.01); *H03F 3/195* (2013.01); *H03F 3/217* (2013.01); *H03F 3/245* (2013.01); *H03F 2200/168* (2013.01); *H03F 2200/451* (2013.01)

(58) Field of Classification Search
CPC ..................................... H04P 1/52; G06F 7/42
USPC .................................. 327/361; 333/118, 131
See application file for complete search history.

(56) References Cited

U.S. PATENT DOCUMENTS

| | | | | |
|---|---|---|---|---|
| 3,697,895 A | * | 10/1972 | Beck | H03H 7/48 |
| | | | | 333/32 |
| 4,769,618 A | | 9/1988 | Parish et al. | |
| 4,774,481 A | | 9/1988 | Edwards et al. | |
| 5,469,129 A | | 11/1995 | Dydyk | |
| 5,485,118 A | | 1/1996 | Chick | |
| 7,474,156 B2 | * | 1/2009 | Fujii | H03F 3/602 |
| | | | | 330/53 |
| 8,203,484 B2 | * | 6/2012 | Chu | H01Q 3/2682 |
| | | | | 342/375 |
| 8,547,177 B1 | * | 10/2013 | Yoo | H03F 3/211 |
| | | | | 330/51 |

(Continued)

OTHER PUBLICATIONS

R. Pengelly, C. Fager and M. Ozen, "Doherty's Legacy: A History of the Doherty Power Amplifier from 1936 to the Present Day," in IEEE Microwave Magazine, vol. 17, No. 2, pp. 41-58, Feb. 2016, doi: 10.1109/MMM.2015.2498081.

(Continued)

*Primary Examiner* — Henry Choe
(74) *Attorney, Agent, or Firm* — LOZA & LOZA, LLP; Joseph G. Swan

(57) ABSTRACT

Provided are, among other things, systems, apparatuses methods and techniques for converting digital data to radio-frequency (RF) signals. One such apparatus includes a reactive-impedance network within which the levels of multiple binary waveforms are individually boosted, before being combined to produce a single, composite output signal.

20 Claims, 17 Drawing Sheets

(56) References Cited

U.S. PATENT DOCUMENTS

| | | | |
|---|---|---|---|
| 9,391,656 B2 * | 7/2016 | Pagnanelli | H04B 1/1081 |
| 9,685,975 B2 | 6/2017 | Pagnanelli | |
| 2005/0099327 A1 | 5/2005 | Robinson et al. | |
| 2011/0063169 A1 | 3/2011 | Chen et al. | |
| 2012/0293352 A1 | 11/2012 | Adlerstein | |
| 2014/0035652 A1 | 2/2014 | Ferndahl et al. | |
| 2016/0043758 A1 | 2/2016 | Pagnanelli | |
| 2016/0226509 A1 | 8/2016 | Pagnanelli | |

OTHER PUBLICATIONS

Aghaee, Fateme & Ostadzadeh, Saeed. (2017). "Distributed amplifier: a tutorial Review," retrieved from https://www.researchgate.net/publication/318492416_Distributed_amplifier_a_tutorial_Review on Sep. 2, 2021.

R. Darraji, F. M. Ghannouchi and O. Hammi, "A Dual-Input Digitally Driven Doherty Amplifier Architecture for Performance Enhancement of Doherty Transmitters," in IEEE Transactions on Microwave Theory and Techniques, vol. 59, No. 5, pp. 1284-1293, May 2011, doi: 10.1109/TMTT.2011.2106137.

A. Medi, "Distributed Amplifiers," retrieved from http://ee.sharif.edu/~mmic/notes/DA.pdf on Sep. 2, 2021.

W. M. Gaber, P. Wambacq, J. Craninckx and M. Ingels, "A CMOS IQ Digital Doherty Transmitter using modulated tuning capacitors," 2012 Proceedings of the ESSCIRC (ESSCIRC), 2012, pp. 341-344, doi: 10.1109/ESSCIRC.2012.6341324.

Extended European Search Report in the application's corresponding EPO application No. 21194196.8.

* cited by examiner

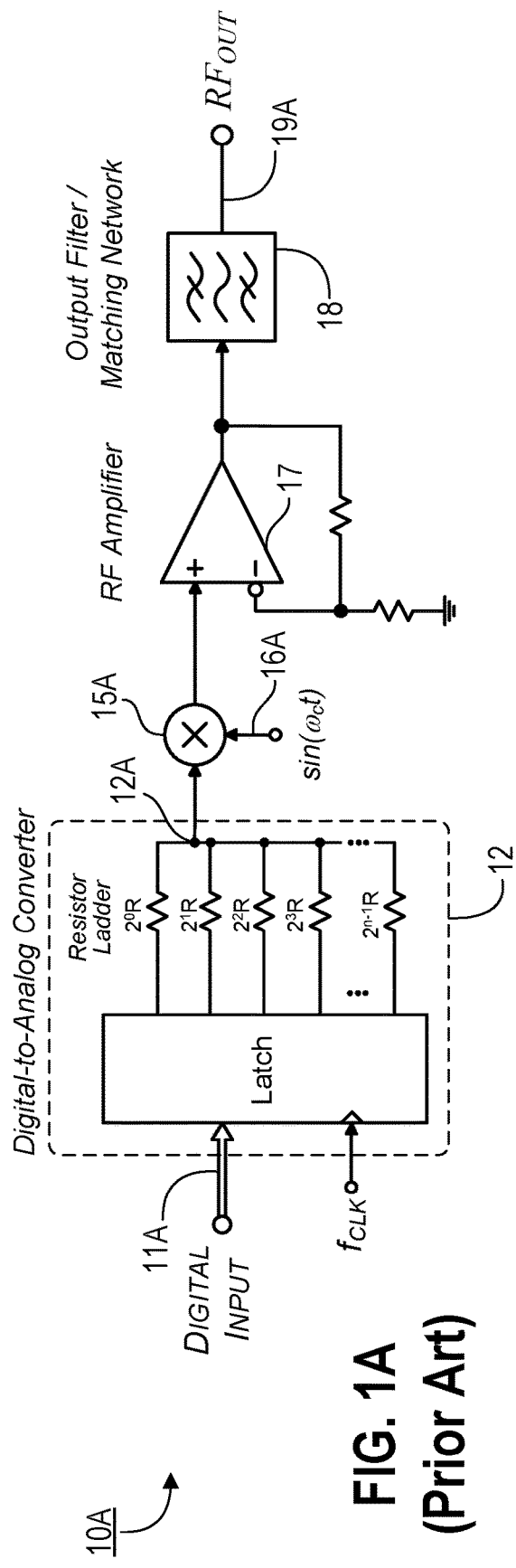
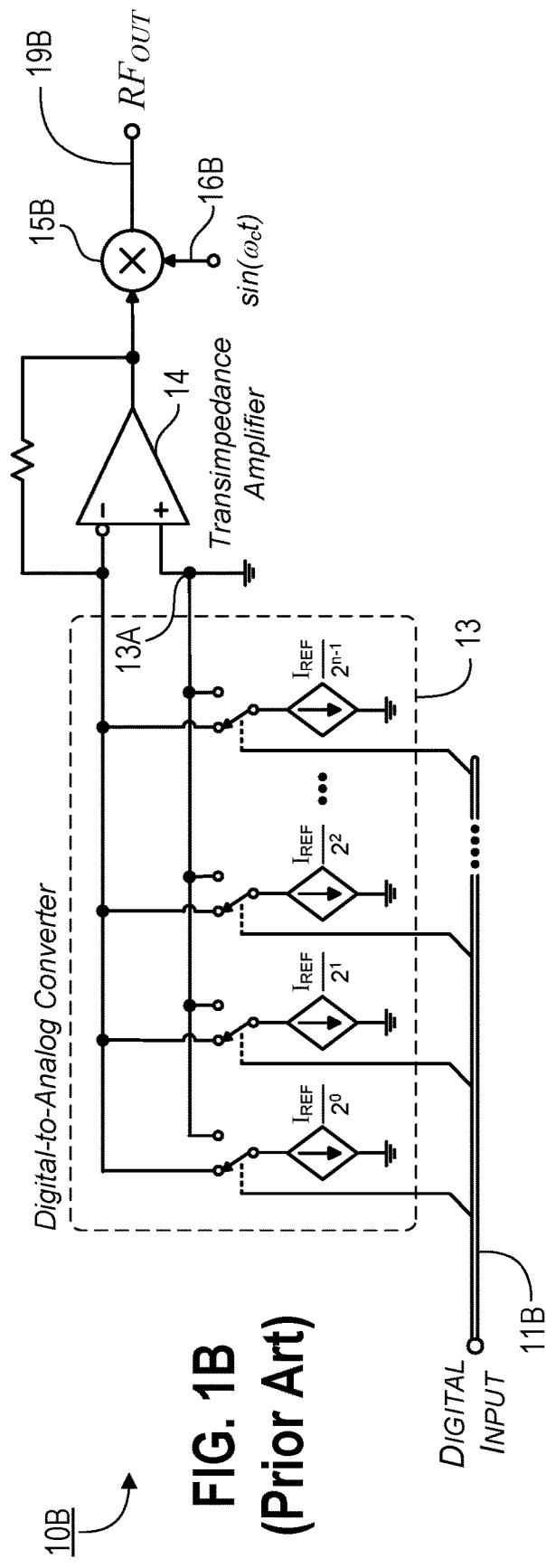
FIG. 1A (Prior Art)
FIG. 1B (Prior Art)

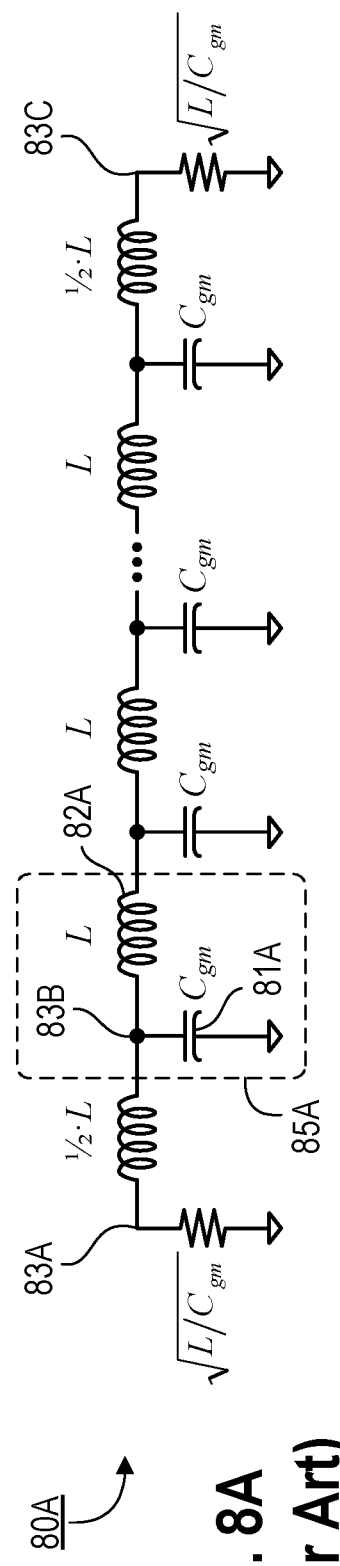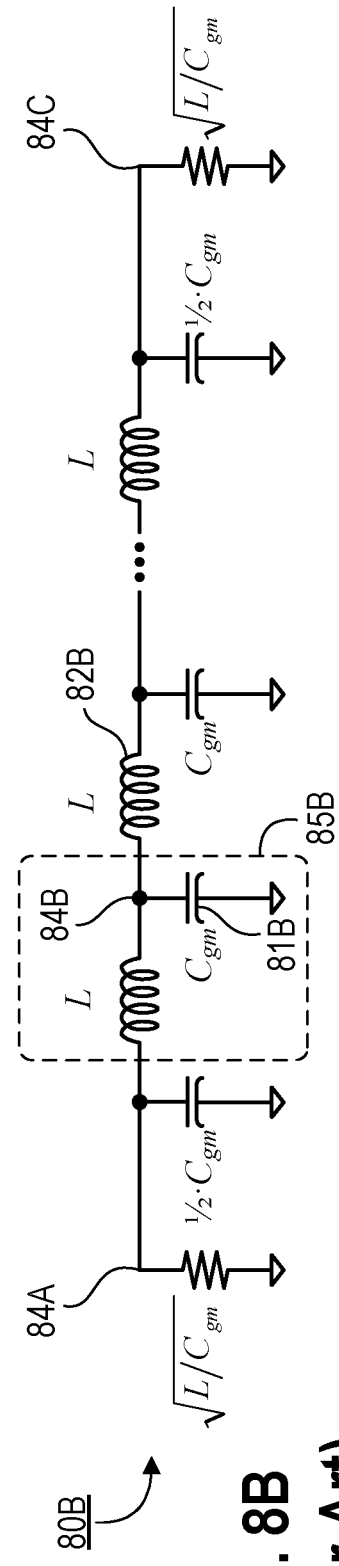
FIG. 8A (Prior Art)
FIG. 8B (Prior Art)

DISTRIBUTED CONVERSION OF DIGITAL DATA TO RADIO FREQUENCY

FIELD OF THE INVENTION

The present invention pertains to systems, apparatuses, methods and techniques for the conversion of digital data to radio-frequency (RF) signals. It is particularly applicable to radar systems and mobile networking systems, which need to operate over a wide range of carrier frequency bands, and produce high-level output signals with high power-added efficiency.

BACKGROUND

Many applications in modern electronics require that digital data, generated using computers or mobile devices, be converted to radio-frequency signals for transmission over wireless or wireline channels. The process can involve modulating a carrier wave with digital data, and then boosting that modulated-carrier wave to a high-level output. The process of modulating a carrier wave with digital data typically includes a number of possible steps, which are illustrated in the diagrams of conventional converters 10A in FIG. 1A, and 10B in FIG. 1B. Converter 10A first takes digital data as discrete-time digital inputs 11A, and then using a weighted network of resistors, performs a digital-to-analog conversion within block 12. The output of digital-to-analog conversion block 12 is then modulated onto sinusoidal RF carrier 16A, using frequency-mixer 15A. The resulting modulated RF waveform is then boosted to a high-level output by RF power-amplifier 17, and bandlimited by output filter 18. Output filter 18 is often a resonating structure that for maximum power transfer, matches the output impedance of the power-amplifier to the load seen at output node 19A. Converter 10B operates in similar fashion, except that a weighted network of resistors is replaced by a weighted network of switched current sources, and boosting to a high-level output happens with power-amplifier 14, prior to carrier modulation that occurs in frequency-mixer 15B. The process of carrier modulation is sometimes referred to as upconversion from baseband to RF. When multiple signals from weighted resistors or weighted current sources are combined at a single node (e.g., nodes 12A and 13A), the accumulation of intrinsic capacitances can limit the speed and/or bandwidth of the digital-to-analog converters, and power amplifiers that follow. Also, impedance-matching circuits (e.g., filter 18) are inherently narrowband devices that limit operating frequency ranges. Consequently, conventional circuits such as converters 10A and 10B are unable to accurately convert high-speed digital data, or operate over a wide range of carrier frequency bands.

Conventionally, much effort has been made to increase the power handling capabilities and power-added efficiencies of the power-amplifiers following digital-to analog conversion (e.g., amplifier 17 that follows circuitry 12 of converter 10A, and amplifier 14 that follows circuitry 13 of converter 10B). One such conventional amplifier is balanced amplifier 20 shown in FIG. 2. Constituent amplifiers 25A&B are matched devices and are operated in parallel using input hybrid coupler 22A and output hybrid coupler 22B. Because of the isolation provided by coupler 22B, the signal level at output 29 can have twice the power as what might be available from either of the constituent amplifiers in a standalone arrangement. Losses in output coupler 22B, however, reduce the power-added efficiency of conventional balanced amplifiers, and the input/output hybrid couplers are inherently narrowband structures which limit the utility of these amplifiers for boosting high-speed signals.

A popular modification to balanced amplifier 20, results in Doherty amplifier 30 of FIG. 3. Like balanced amplifier 20, Doherty amplifier 30 employs two constituent amplifiers in a parallel arrangement. In the Doherty configuration, however, constituent amplifiers 35 and 36 are intentionally mismatched, and are coupled at the output using quarter-wave transmission lines 37A&B, which are joined at junction point 38. Constituent amplifier 35 is biased for operation as Class AB, and boosts the level of input signal $x_m$ on line 33, in a manner that is expected to add distortion in the form of compression or clipping. Constituent amplifier 36 is biased for operation as Class C, and is designed to provide an added boost when its input signal $x_p$ on line 34, exceeds a particular threshold level related to the clipping introduced to signal $x_m$ at the output of amplifier 35. The outputs of constituent amplifiers 35&36 are combined at node 38, such that the boost applied by constituent amplifier 36 compensates for the compression or clipping introduced by constituent amplifier 35, and consequently, the output signal on line 39 has close to the same fidelity as the input signal on line 31. Output coupling using quarter-wave transmission lines provides a necessary biasing interaction between the two parallel amplifiers, but also limits the RF signal levels on line 39 to the maximum that can be tolerated by either of the constituent amplifiers. Also, the quarter-wave transmission lines are inherently narrowband structures that limit the utility of these amplifiers for boosting high-speed signals, or operating over a wide range of carrier frequency bands. But reduced losses in quarter-wave transmission lines 37A&B, compared to conventional hybrid coupler 22B, results in improved power-added efficiency relative to the balanced amplifier of FIG. 2.

Converter 40 shown in FIG. 4, is a conventional circuit that employs the Doherty amplifier arrangement in the conversion of digital data to RF signals. The circuitry of converter 40 shares many similarities with that of converter 10A in FIG. 1A, with the primary difference being adaptations for replacing RF amplifier 17 of converter 10A, with Doherty amplifier 47C. Converter 40 is sometimes referred to as a dual-input, digitally-driven Doherty amplifier. Rather than being dependent on the intrinsic compression properties of Class AB amplifier 47A, a digital input signal is intentionally decomposed into: 1) a clipped signal for input on line 41A and subsequent boosting by Class AB amplifier 47A; and 2) a complementary peaking signal for input on line 41B and subsequent boosting by Class C amplifier 47B. This arrangement eliminates the need for an input hybrid coupler (e.g., hybrid coupler 32 in FIG. 3). More importantly, this arrangement enables more precise reconstruction of a high-fidelity output signal on line 49, by providing digital control over the compression applied to the signal component $y_m$ at the output of amplifier 47A, and the peaking applied to the signal component $y_p$ at the output of amplifier 47B. But the signal levels on line 49 are limited to the maximum that can be tolerated by either of amplifiers 47A&B, and as inherently narrowband structures, the quarter-wave transmission lines limit the utility of these amplifiers for boosting high-speed signals, or operating over a wide range of carrier frequency bands.

Converter 50, shown in FIG. 5, also utilizes the principle of Doherty amplification, where clipped (e.g., signal $y_m$ on line 56A) and peaked (e.g., signal $y_p$ on line 56B) components of an input signal are separately amplified and combined using quarter-wave transmission lines (e.g., transmission lines 58A&B). Converter 50 is an adaptation to converter 10B of FIG. 1B, where the operation of signal boosting performed by amplifier 14 of converter 10B, and the operation of carrier modulation performed by frequency-mixer 15B, are both integral to the digital-to-analog conversion process occurring within blocks 54A&B of converter 50. Converter 50 is sometimes referred to as a direct-digital RF modulator. Like the arrangement of converter 40, the arrangement of converter 50 provides digital control of the compression applied to the signal component y m at the output of digital-to-analog converter 54A, and to the peaking applied to the signal component y p at the output of digital-to-analog converter 54B. And this enables more precise reconstruction of a high-fidelity output signal on line 59. But conventional techniques for digital-to-analog conversion have limited capabilities for converting and boosting high-speed signals across a wide range of carrier frequency bands. The suitability of converter 50 for operating at high-speed and over a wide range of carrier frequencies, is further limited by the quarter-wave coupling structure comprising transmission lines 58A&B, which is inherently narrowband.

Unlike the balanced amplifier and the Doherty amplifier, the distributed amplifier 60 shown in FIG. 6, is conventionally utilized for effectively boosting very high-speed signals across a wide range of carrier frequency bands. Distributed amplifiers, such as amplifier 60 shown in FIG. 6, utilize an arrangement where multiple amplifiers in parallel, create artificial transmission lines. Unlike the coupling structures utilized in balanced and Doherty amplifier configurations, artificial transmission lines which are conventionally formed by the concatenation of identical reactive-impedance segments, are inherently wideband structures. Distributed amplifier 60, shown in FIG. 6, is a common configuration where an RF input signal on line 61 drives first artificial transmission line and an RF output signal on line 69 is taken from second artificial transmission line Both the artificial transmission lines comprise reactive-impedance segments (e.g., segment 67A&B) formed from discrete inductors (e.g., inductors 63A&B) and the intrinsic input or output capacitances of a series of gain elements in parallel (e.g., amplifiers 66A&B). In addition, both artificial transmission lines are terminated at each end (e.g., using resistors 62A&B) with a characteristic impedance $R_{term}=\sqrt{L/C_{gm}}$, where L is the inductance of the discrete inductors and $C_{gm}$ is the intrinsic capacitance of an amplifier at its input and/or output. Each of the identical reactive-impedance segments introduces a delay equal to $t_{PD}=\sqrt{L \cdot C_{gm}}$, such that the total propagation delay from the RF input at line 61, to the RF output at line 69, is equal through any of the signal paths passing through any of the parallel amplifiers. Conventional distributed amplifiers are effective at boosting the level of very high-speed signals, but generally do not provide good power-added efficiency. The reasons for poor power-added efficiency include power dissipation in termination resistor 62B, and the need to bias gain elements (e.g., amplifiers 66A&B) for linear operation so that analog (i.e., multi-level) signals can be boosted without introducing significant distortion. And like Doherty amplifiers, there is no isolation between the amplifier segments, and consequently the RF signal levels at output 69, is limited to the maximum that can be tolerated by each of the constituent amplifiers.

Converter 70 shown in FIG. 7, is a conventional circuit that employs the principles of distributed amplification in the conversion of digital data to RF signals. Converter 70 employs multiple artificial transmission lines, coupled with multiple gain elements, to convert a set of digital inputs on lines 71A-H into an RF output on line 79. The circuitry of converter 70 shares many similarities with that of distributed amplifier 60, and is sometimes referred to as a digitally-driven RF combiner. Each of artificial transmission lines 72A-G, comprises a reactive-impedance segment formed from discrete inductors (e.g., inductors 75A&B) and the parasitic input or output capacitances of a series of identical gain elements that operate in a parallel arrangement (e.g., amplifiers 74A-C of artificial transmission line 72E). In addition, each of artificial transmission lines 72A-G is terminated at each end (e.g., using discrete resistors 76A&B of artificial transmission line 72F) with a characteristic impedance $R_{term}=\sqrt{L/C_{gm}}$, where L is the inductance of the discrete inductors and $C_{gm}$ is the intrinsic capacitance at the input or output of a particular gain element. Each of the identical reactive-impedance segments and associated gain elements, create signal propagation paths that introduce a delay equal to $t_{PD}=\sqrt{L \cdot C_{gm}}$, such that the total delay from any of the digital inputs on lines 71A-H to the RF output at line 69, is equal to $3 \cdot t_{PD}$. This arrangement means that the digital inputs on lines 71A-H do not need to be shifted in time to ensure proper alignment with each other on output line 79. Digitally-driven RF combiners are effective at converting very high-speed signals and operating over a wide range of carrier frequency bands, but they do not provide good power-added efficiency. One reason for poor power-added efficiency is the power dissipation in the many resistors (e.g., resistors 76A&B) that are needed to terminate both ends of the multiple artificial transmission lines comprising the structure. Another reason for poor power-added efficiency is that, except for the gain elements at the input of the first stage of combining (e.g., amplifiers 73A-H of artificial transmission lines 72A-D), which can be biased for nonlinear (hard-limiting) operation because they are used to boost binary (i.e., two-level digital) signals, the remainder of the gain elements boost multilevel signals and must be biased for linear operation, in order to prevent signal distortion (i.e., biasing for nonlinear operation is more power-efficient than biasing for linear operation). And like distributed amplifiers, there is no isolation between the gain elements in each artificial transmission line, and consequently, the output power for a particular artificial transmission line, is limited to a signal level that can be tolerated by each of its constituent amplifiers (e.g., the output power of artificial transmission line 72F is limited to levels tolerated by gain elements 74A&B, and the output power of artificial transmission line 72G is limited to levels tolerated by gain elements 74C&D). The power-added efficiency of the digitally-driven RF combiner shown in FIG. 7, however, can be better than the power-added efficiency of the distributed amplifier of FIG. 6, which is used to boost analog signals. The reason for this is that gain elements can be biased to reflect the condition that the larger number of gain elements comprising earlier transmission line stages (e.g., artificial transmission lines 72A-D), are exposed to lower signal levels than the fewer number of gain elements comprising later transmission line stages (e.g., artificial transmission lines 72E&F or 72G).

FIGS. 8A-D provide examples of conventional networks which are formed by concatenating reactive-impedance segments. Networks 80A&B, which are utilized for constructing the artificial transmission lines used in conventional distributed power-amplifiers, are sometimes referred to as doubly-terminated networks, because each end of the network is terminated in a characteristic impedance (e.g., $\sqrt{L/C_{gm}}$). Circuit employs a configuration where the first and last reactive elements are series inductances, with inductive reactance equal to ½·L, and circuit 80B employs a configuration where the first and last reactive elements are shunt capacitances, with capacitive reactance equal to ½ ·$C_{gm}$. Conventionally, networks 80A-B have been considered preferable for the construction of distributed amplifiers because, except for the first and last capacitors which attach to a terminating node at the end of network 80B (e.g., capacitive elements at terminating nodes 84A&C), the capacitive reactances at each interior node (e.g., interior nodes 83B and 84B) of networks 80A&B are equal (e.g., equal to a value of $C_{gm}$). This condition permits each gain element in a distributed amplifier to be matched, since the boosting capability of a gain element is directly related to its intrinsic input or output capacitance. Matched gain elements that provide signal boosting with uniform weighting is a preferred condition for the case of an analog input signal (i.e., multi-level input signal 61 in FIG. 6). Also, except for the first and last inductors in network 80A, the inductive reactances associated with the interior nodes of networks are equal (e.g., equal to a value of L), and this condition can lead to improved consistencies in manufacturing. The gain elements associated with each of the reactive-impedance segments typically are implemented using conventional topologies that include: 1) the common-source amplifier 90A of FIG. 9A; 2) the dual-input, multiplying cascode 90B of FIG. 9B; 3) the broadband, variable-gain cascode 90C of FIG. 9C; and/or 4) the variable-gain/delay amplifier 90D of FIG. 9D. Distributed amplifiers constructed from networks of the type illustrated in FIGS. 8A&B, however, will generally exhibit poor power-added efficiency, since power is dissipated in the termination resistors located at each end of the network.

Network 80C of FIG. 8 illustrates an alternative structure which also comprises a series of concatenated reactive-impedance segments. Network 80C is sometimes referred to as a singly-terminated network, since only one end of the network is terminated in a characteristic impedance (e.g., $\sqrt{L/C_{gm}}$. In the singly-terminated network the inductive and capacitive reactances at the nodes differ, such that larger inductances and capacitances are needed for reactive-impedance segments that are further from the terminated end of the network (e.g., further from terminal node 86E). Although conventional distributed amplifiers have not utilized singly-terminated networks of the type illustrated in FIG. 8C, singly-terminated networks of this type are commonly utilized in the construction of conventional frequency-selective filters, where a voltage or current source drives a matched-impedance (or resistive) load. Network 80D of FIG. 8 illustrates another alternative structure, where like network 80C, the inductive and capacitive reactances differ at different nodes. But unlike the singly-terminated structure of network 80C, network 80D is a doubly-terminated structure with termination impedances at each of its ends (e.g., termination resistors 87B&C of FIG. 8D). Additionally, instead of inductive and capacitive reactances becoming progressively smaller from one end of the network to the other, the inductive and capacitive reactances of network 80D are highest at the center of the structure (e.g., at internal node 88C), and then decrease symmetrically in the direction of the two terminating nodes (e.g., terminal nodes 88A&E).

Conventional methods for converting digital-data to radio-frequency (RF) signals do not perform well in applications that require operation over a wide range of carrier frequency bands, or must produce high-level output signals with high power-added efficiency. Distributed networks can be used to improve the amount of boosting introduced to high-speed signals, and also improve the range of carrier frequencies that can be utilized. But generally, these improvements come at the expense of reduced or unacceptable levels of power-added efficiency. New apparatuses and methods are needed to support advances in wireless and wireline systems, which need to operate over a wide range of carrier frequency bands, and produce high-level output signals with high power-added efficiency.

The foregoing discussion includes, in addition to a description of certain relevant prior art, the present inventor's analysis of some of the problems and shortcomings associated with such prior art. The discovery of such problems and shortcomings was a part of the process that led to the inventions discussed in the following sections. Only knowledge explicitly described in the foregoing discussion as being "conventional" or "prior art" is intended to be characterized as such.

SUMMARY OF THE INVENTION

The present invention provides, among other things, improved apparatuses for the conversion of digital data to radio-frequency (RF) signals. Certain embodiments of the present invention utilize reactive-impedance networks to boost and combine into a complete (composite) signal, a set of binary or modulated-carrier waveforms that represent the individual bits of an n-bit data sample. Compared to conventional circuits used for converting digital data to RF signals, such as dual-input digitally-driven Doherty amplifiers or direct-digital RF modulators, a converter apparatus according to the preferred embodiments of the present invention typically can provide for operation over a wider range of carrier frequencies, as well as for boosting of high-speed signals with greater power-added efficiency.

One specific embodiment of the invention is directed to an apparatus for converting digital data to radio-frequency (RF) signals, and includes: 1) an input line for accepting or receiving binary-encoded data samples; 2) a decoder that decomposes the data samples into a number of binary waveforms, or otherwise generates such binary waveforms from such data samples; 3) a reactive-impedance network comprising one or more segments, each segment having a shunt capacitive reactance, as either an active (e.g., gain element) or passive (i.e., capacitor) device, and a series inductive reactance (preferably implemented as a discrete inductive element); and 4) an output line that is coupled to one end of the reactive-impedance network. The multiple binary waveforms are combined so that the output line provides a single, composite output. The number of binary waveforms at the output of the decoder preferably equals the number of bits used to encode the data sample on the input line, and each binary waveform preferably is associated with one of the shunt capacitive elements comprising the reactive-impedance network. The reactive-impedance network preferably is singly-terminated, so that there are no shunt resistances at either end of the network, and different amounts of capacitive reactance preferably are associated with some or all of the network nodes. Preferably, the most-significant bit of the binary-encoded data samples is associated with the node having the largest capacitive reactance. The reactive-impedance network preferably includes a number of gain elements that boost the signal level of a binary waveform, and preferably: 1) the number of gain elements is equal to the number of bits used to encode the data samples on the input line; 2) the amount of boost applied by each of the gain elements is directly related to the digital-encoding scheme (or technique) associated with the input data samples; and 3) the gain elements are biased for operation as Class D amplifiers. In alternate embodiments, however, the gain elements are biased for other than Class D operation. Preferably, the frequency response from the output of any gain element to the output line is approximately all-pass within the intended operating bandwidth of the apparatus. In addition, the various signal paths from the output of each gain element to the output line, preferably have approximately equal propagation delays, such that signals from such various paths arrive simultaneously at the output line.

A second specific embodiment of the invention is directed to an apparatus for converting digital data to radio-frequency (RF) signals, and includes: 1) an input line for accepting binary-encoded data samples; 2) a decoder that decomposes the data samples into a number of binary waveforms, or otherwise generates such binary waveforms from such data samples; 3) a bank of frequency-mixers that individually modulate the binary waveforms onto separate replicas of a carrier wave to produce modulated-carrier waveforms; 4) a reactive-impedance network comprising one or more segments, each segment having a shunt capacitive reactance, as either an active (e.g., gain element) or passive (i.e., capacitor) device, and a series inductive reactance; 4) a lowpass filter with an input that is coupled to one end of the reactive-impedance network; and 5) an output line that is coupled to the output of a lowpass filter. The modulated-carrier waveforms at the output of each frequency-mixer are combined at the input of the lowpass filter to produce a single, composite output. The number of binary waveforms at the output of the decoder preferably is equal to the number of bits used to encode the data sample on the input line. Also, the number of frequency-mixers preferably is equal to the number of binary waveforms, and each of the frequency-mixers is associated with one of the shunt capacitive elements comprising the reactive-impedance network. The reactive-impedance network preferably is singly-terminated, so that there are no shunt resistances at either end of the network, and different amounts of capacitive reactance are associated with some or all of the network nodes. Preferably, the most-significant bit of binary-encoded data sample is associated with the node having the largest capacitive reactance. The reactive-impedance network preferably includes a number of gain elements that boost the signal level of a modulated-carrier wave, and more preferably: 1) the number of gain elements is equal to the number of modulated-carrier waves generated by the bank of frequency-mixers; 2) the amount of boost applied by each of the gain elements is directly related to the digital-encoding scheme associated with the input data samples; and 3) the gain elements are biased for operation as Class AB amplifiers. However, in alternate embodiments, the gain elements are biased for other than Class AB operation. The frequency mixing operation performed by the frequency-mixers may occur separately from the boosting operation performed by the gain elements, or alternatively, the frequency mixing and boosting functions may be performed as an integrated operation within the gain elements. The frequency response, from the output of any gain element to the input of the lowpass filter, preferably is approximately all-pass within the intended operating bandwidth of the apparatus. In addition, the signal paths from the output of each gain element to the output line, preferably have approximately equal propagation delays, such that signals from the various paths arrive simultaneously at the output line. Preferably, the frequency response of the lowpass filter provides for a combination of minimal passband insertion loss, and sufficient stopband attenuation to remove unwanted harmonics and signal images from the output of the apparatus.

A third specific embodiment of the invention is directed to an apparatus for converting digital data to radio-frequency (RF) signals, and includes: 1) an input line for accepting binary-encoded data samples as a serial bit stream; 2) a decoder that decomposes the data samples into a number of binary waveforms, or otherwise generates such binary waveforms from such data samples; 3) a bank of delay lines that cause the binary waveforms at the output of the decoder function to be progressively shifted in time; 4) a bank of frequency-mixers that individually modulate the time-shifted binary waveforms onto separate phase-shifted replicas of a carrier wave to produce modulated-carrier waveforms; 5) a reactive-impedance network comprising one or more segments, each segment having a shunt capacitive reactance, as either an active (e.g., gain element) or passive (i.e., capacitor) device and a series inductive reactance; 6) a lowpass filter with an input that that is coupled to the unterminated end of the reactive-impedance network; and 7) an output line that is coupled to the output of the lowpass filter. The modulated-carrier waveforms at the outputs of the frequency-mixers are combined at the input of the lowpass filter to produce a single, composite output. The number of binary waveforms at the output of the decoder function preferably is equal to the number of bits used to encode the data samples provided on the input line as a serial bit stream. And preferably, the number of frequency-mixers is equal to the number of binary waveforms, and each of the frequency-mixers is associated with one of the shunt capacitive elements within the reactive-impedance network. The reactive-impedance network includes a number of gain elements that boost the signal level of a modulated-carrier wave, and preferably: 1) the number of gain elements is equal to the number of modulated-carrier waves generated by the bank of frequency-mixers; 2) the amount of boost applied by each of the gain elements is directly related to the digital-encoding scheme associated with the input data samples; and 3) the gain elements are biased for operation as Class D amplifiers. However, in alternate embodiments, the gain elements are biased for other than Class D operation. The reactive-impedance network preferably is a doubly-terminated network (i.e., a terminating impedance at each end, one typically being the load), and the signal paths from the output of each gain element to the output line, are shifted in time such that in conjunction with the time-shift introduced by the delay lines and the phase-shift applied to each of the carrier waves, signals from the various paths arrive in coherent fashion at the output line (e.g., substantially the same relative timing as exists at the input line). Except for terminating nodes, there preferably is an equal amount of capacitive reactance associated with each of the network nodes. The frequency response from the output of any gain element to the input of the lowpass filter, preferably is approximately all-pass within the intended operating bandwidth of the apparatus. Preferably, the frequency response of the lowpass filter provides for a combination of minimal passband insertion loss, and sufficient stopband attenuation to remove unwanted harmonics and signal images from the output of the apparatus.

A fourth specific embodiment of the invention is directed to an apparatus for converting digital data to radio-frequency (RF) signals, and includes: 1) an input line for accepting binary-encoded data samples as a serial bit stream; 2) a serializer-deserializer (SerDes) module that produces binary data samples from the serial bit stream, and decomposes those data samples into a number of binary waveforms, or otherwise generates such binary waveforms from such data samples; 3) a bank of delay lines that cause the binary waveforms at the output of the SerDes module to be progressively shifted in time; 4) a bank of frequency-mixers that individually modulate the time-shifted binary waveforms onto separate phase-shifted replicas of a carrier wave to produce modulated-carrier waveforms; 5) a reactive-impedance network comprising one or more segments, each segment having a shunt capacitive reactance, as either an active (e.g., gain element) or passive (i.e., capacitor) device and a series inductive reactance; and 6) an output line that is coupled to one end of the reactive-impedance network. The modulated-carrier waveforms at the output of each frequency-mixer are combined at the output line to produce a single, composite output. The number of binary waveforms at the output of the SerDes module preferably is equal to the number of bits used to encode the data samples provided on the input line as a serial bit stream. Also, in the preferred embodiments, the number of frequency-mixers is equal to the number of binary waveforms, and each of the frequency-mixers is associated with one of the shunt capacitive elements comprising the reactive-impedance network. The reactive-impedance network includes a number of gain elements that boost the signal level of a modulated-carrier wave, and preferably: 1) the number of gain elements is equal to the number of modulated-carrier waves generated by the bank of frequency-mixers; 2) the amount of boost applied by each of the gain elements is directly related to the digital-encoding scheme associated with the input data samples; and 3) the gain elements are biased for operation as Class AB amplifiers. However, in alternate embodiments, the gain elements are biased for other than Class AB operation. The reactive-impedance network preferably is a doubly-terminated network (i.e., a terminating impedance at each end, one typically being the load), and the signal paths from the output of each gain element to the output line, are shifted in time such that in conjunction with the time-shift introduced by the delay lines and the phase-shift applied to each of the carrier waves, signals from the various paths arrive in coherent fashion at the output line (e.g., substantially the same relative timing as exists at the input line). Different amounts of capacitive reactance are associated with some or all of the network nodes, and preferably, the most-significant bit of the binary-encoded data sample is associated with the node having the largest capacitive reactance. The frequency response from the output of any gain element to the output line, preferably is approximately all-pass within the intended operating bandwidth of the apparatus.

An apparatus for converting digital data to radio-frequency (RF) signals which incorporates any of the embodiments of the invention described above, typically can operate over a wider range of carrier frequency bands, and produce high-level output signals with higher power-added efficiency, than any of the conventional methods. This combination of features is especially needed for systems that perform radar and mobile networking functions.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 1A is a block diagram of a conventional circuit that converts digital data to RF signals, using a weighted resistor network, an upconverting mixer, a power amplifier, and a matching network; and FIG. 1B is a block diagram of a conventional circuit that converts digital data to RF signals, using a weighted network of current sources, a power amplifier, and an upconverting mixer.

FIG. 8A is a block diagram of a conventional artificial transmission line comprising multiple reactive-impedance segments, a series inductor as the first reactive element, and a termination impedance at both ends; FIG. 8B is a block diagram of a conventional artificial transmission line comprising multiple reactive-impedance segments, a shunt capacitor as the first reactive element, and a termination impedance at both ends.

DESCRIPTION OF THE PREFERRED EMBODIMENT(S)

Figure 2:
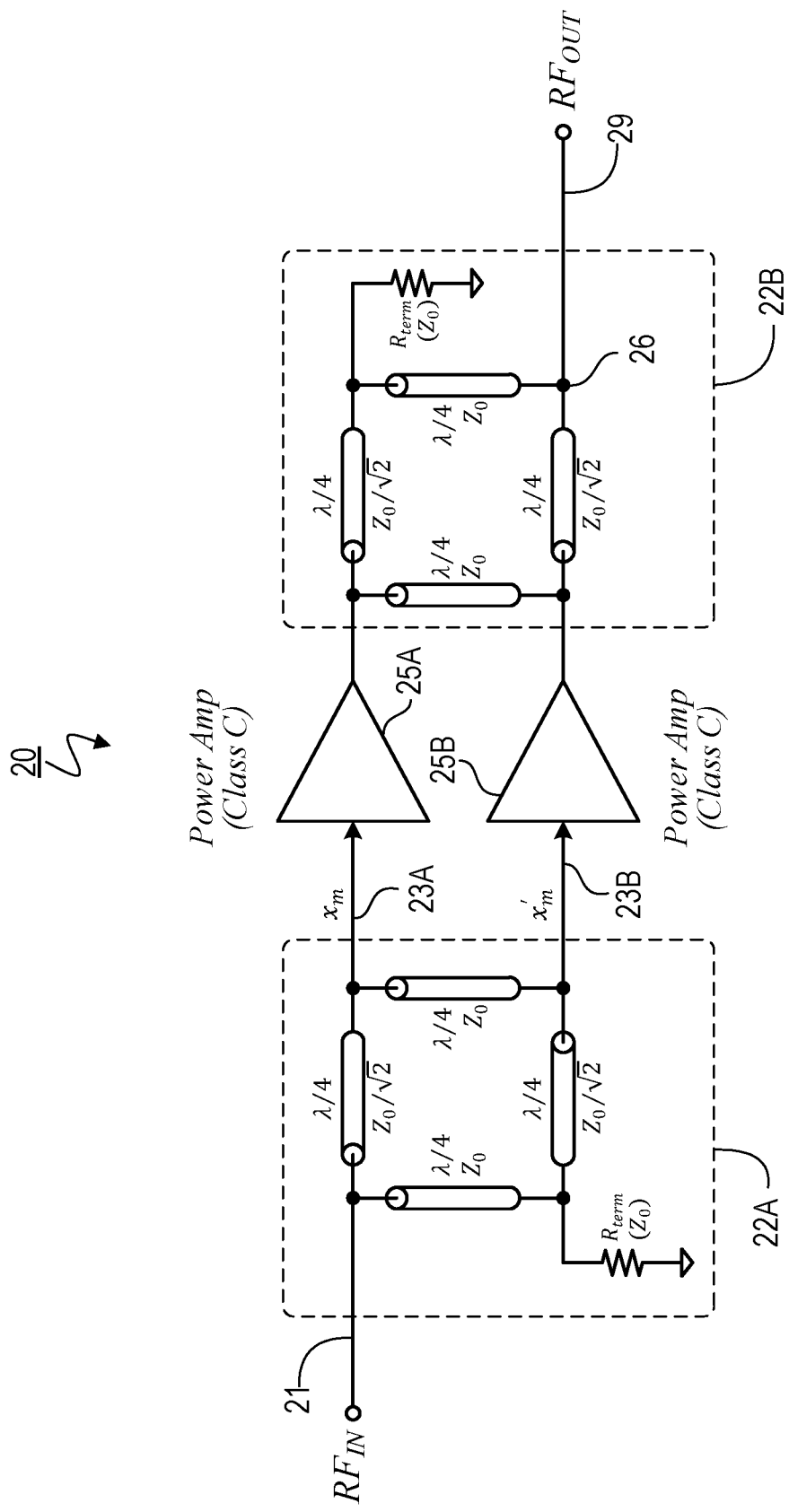
FIG. 2 is a block diagram of a conventional balanced power-amplifier, comprising an input hybrid coupler, a parallel amplifier stage, and an output hybrid coupler.
Figure 3:
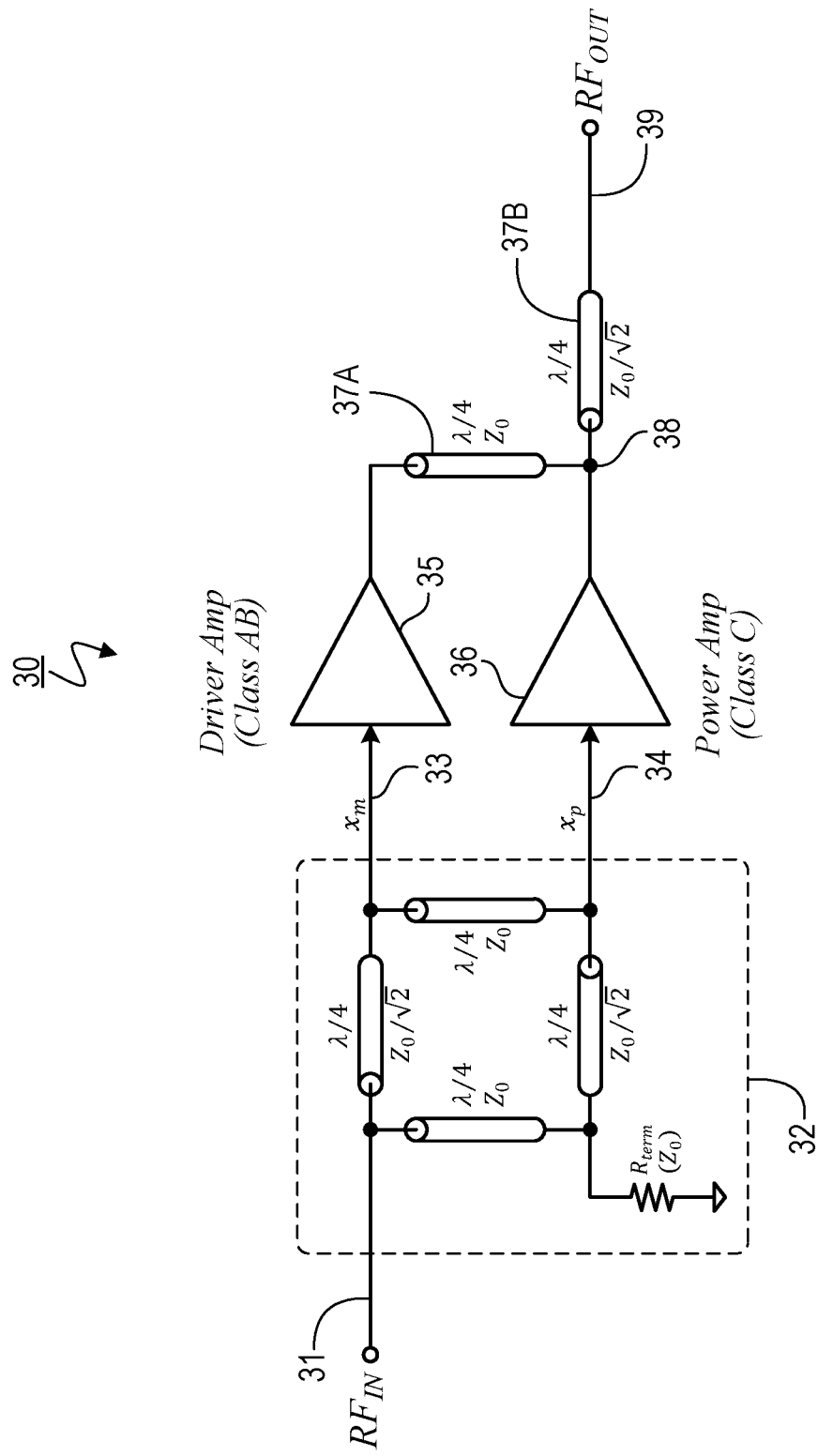
FIG. 3 is a block diagram of a conventional Doherty power-amplifier, comprising an input hybrid coupler, a parallel amplifier stage, and an output coupling structure which utilizes quarter-wave transmission lines.
Figure 4:
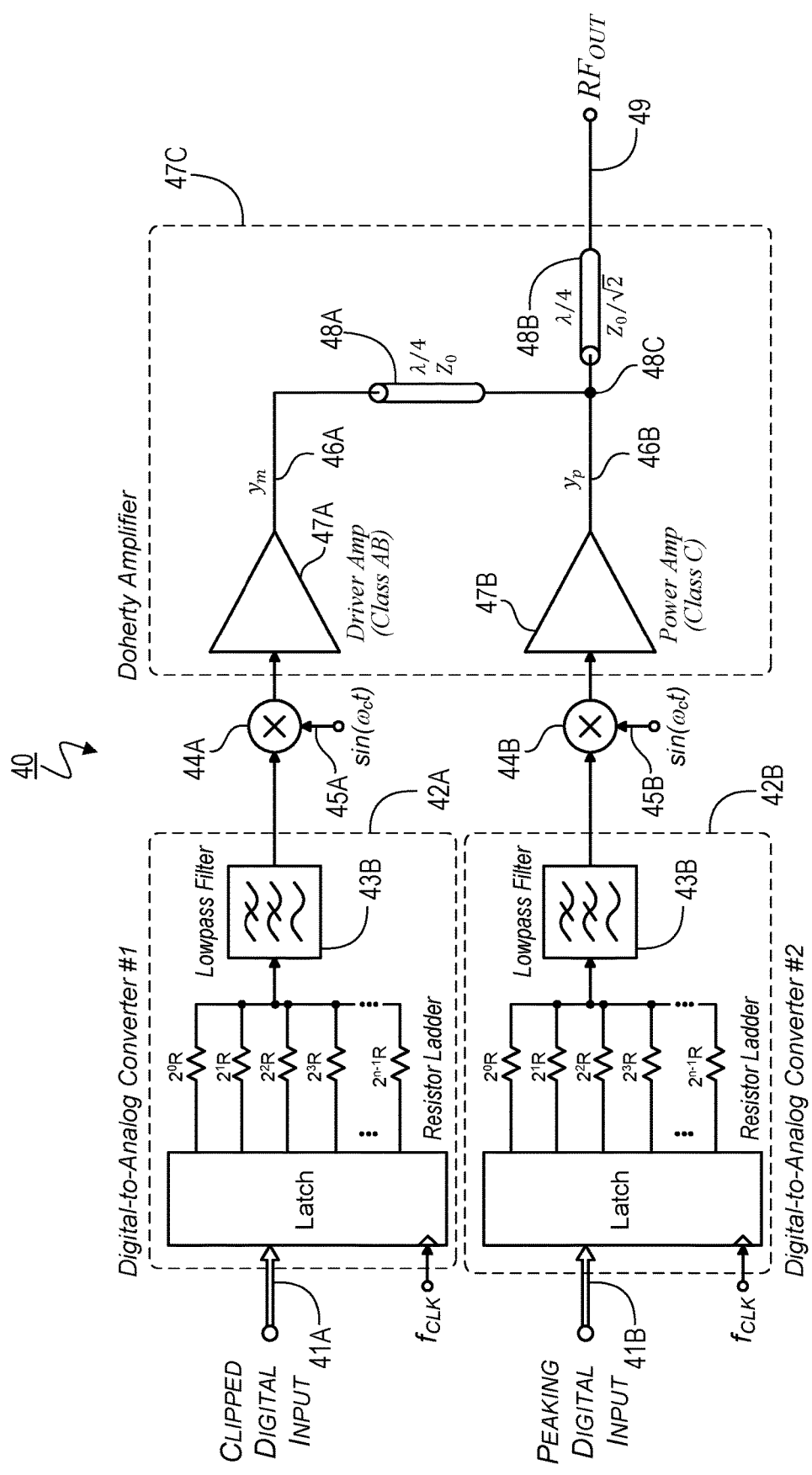
FIG. 4 is a block diagram of a conventional dual-input, digitally-driven Doherty amplifier that converts digital data to RF signals, utilizing a first digital-to-analog converter for a clipped signal component, a second digital-to-analog converter for a peaked signal component, along with a pair of frequency-mixers and a Doherty power-amplifier.
Figure 5:
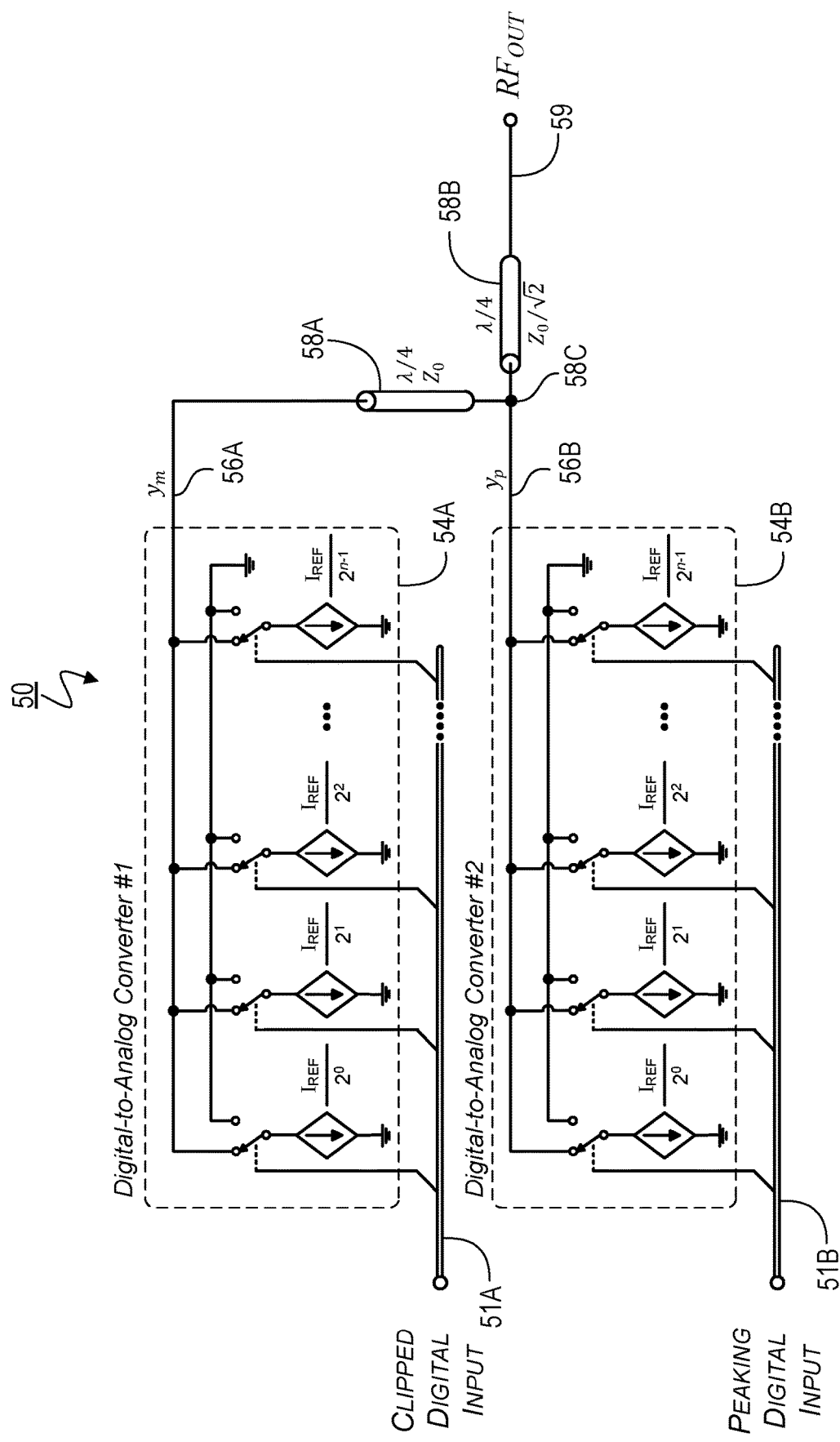
FIG. 5 is a block diagram of a conventional direct-digital RF modulator that converts digital data to RF signals, utilizing a first high-power digital-to-analog converter for a clipped signal, a second high-power digital-to-analog converter for a peaked signal, and a coupling structure comprising quarter-wave transmission lines.
Figure 6:
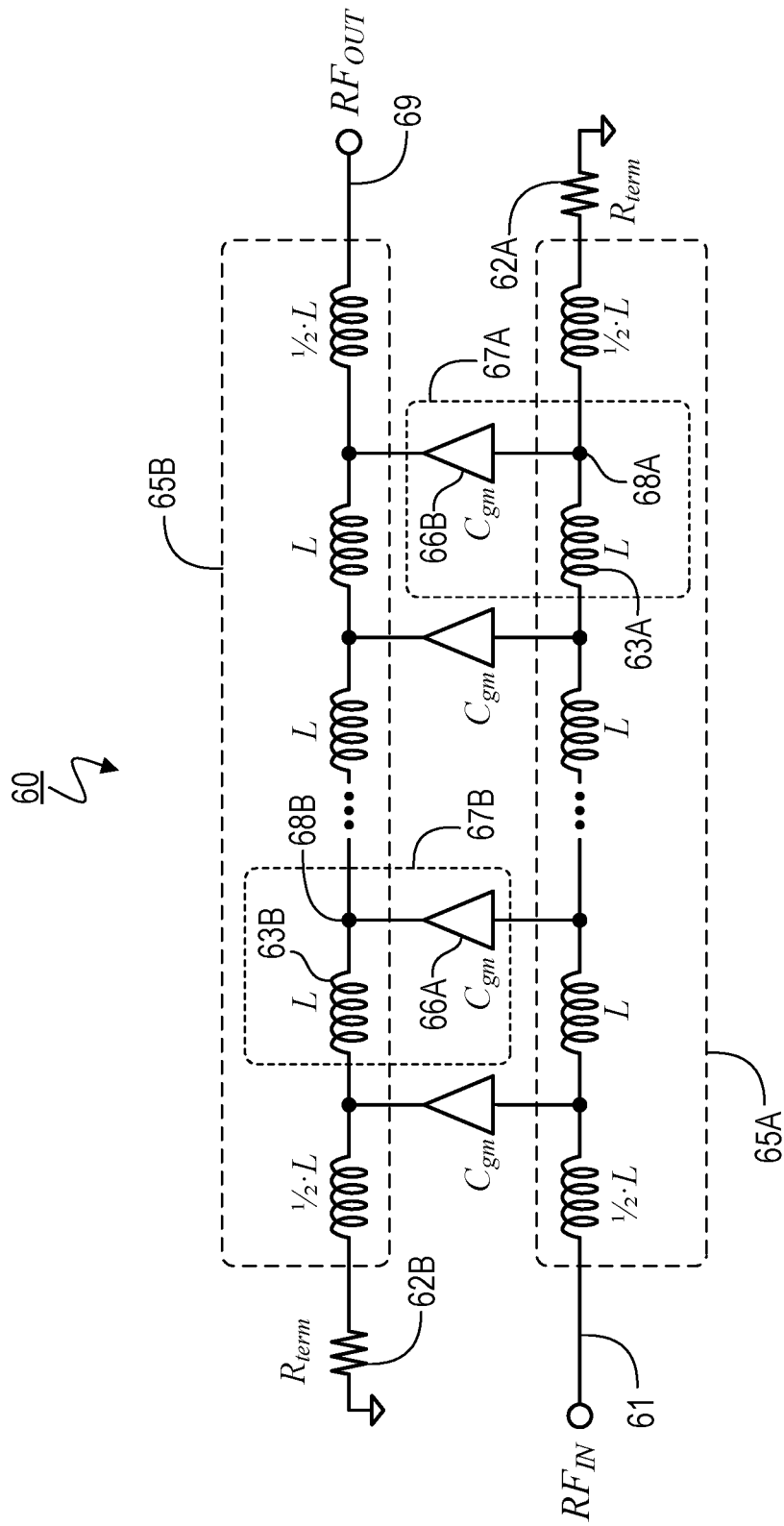
FIG. 6 is a block diagram of a conventional distributed amplifier, which comprises an input transmission line, an output transmission line, and multiple gain elements.
Figure 7:
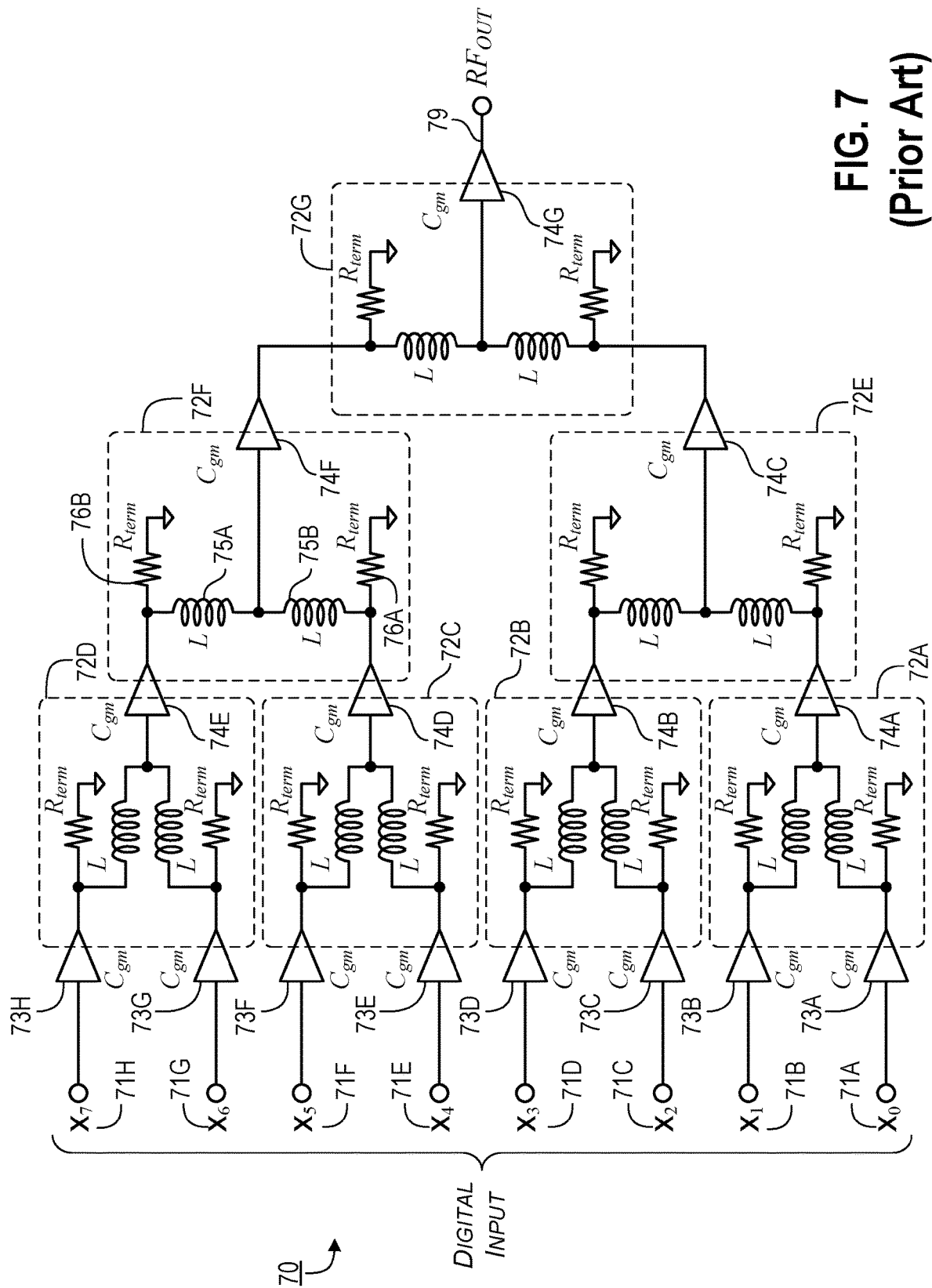
FIG. 7 is a block diagram of a conventional digitally-driven, distributed combiner that converts digital data to RF signals, utilizing multiple artificial transmissions lines and multiple gain elements.

Conventional distributed amplifiers have been developed for boosting high-speed signals, and operating over a wide range of carrier frequency bands (e.g., circuit 60 of FIG. 6). In addition, conventional circuits have been developed that allow digital data to be converted to RF signals, including: 1) dual-input, digitally-driven Doherty amplifiers (e.g., circuit 40 of FIG. 4); 2) direct-digital RF modulators (e.g., circuit 50 of FIG. 5); and 3) digitally-driven distributed combiners (e.g., circuit 70 of FIG. 7). The present inventor has discovered, however, that these conventional circuits do not exhibit the optimal combination of features required by modern wireless and wireline systems. For instance, modern systems require operation over a wide range of carrier frequency bands, and generation of high-level output signals with high power-added efficiency. The present inventor further has discovered that the principles of distributed networks can be adapted and used to create novel structures that increase the capabilities of conventional circuits for converting high-speed digital data to high-level RF signals, with high power-added efficiency.

Figure 10:
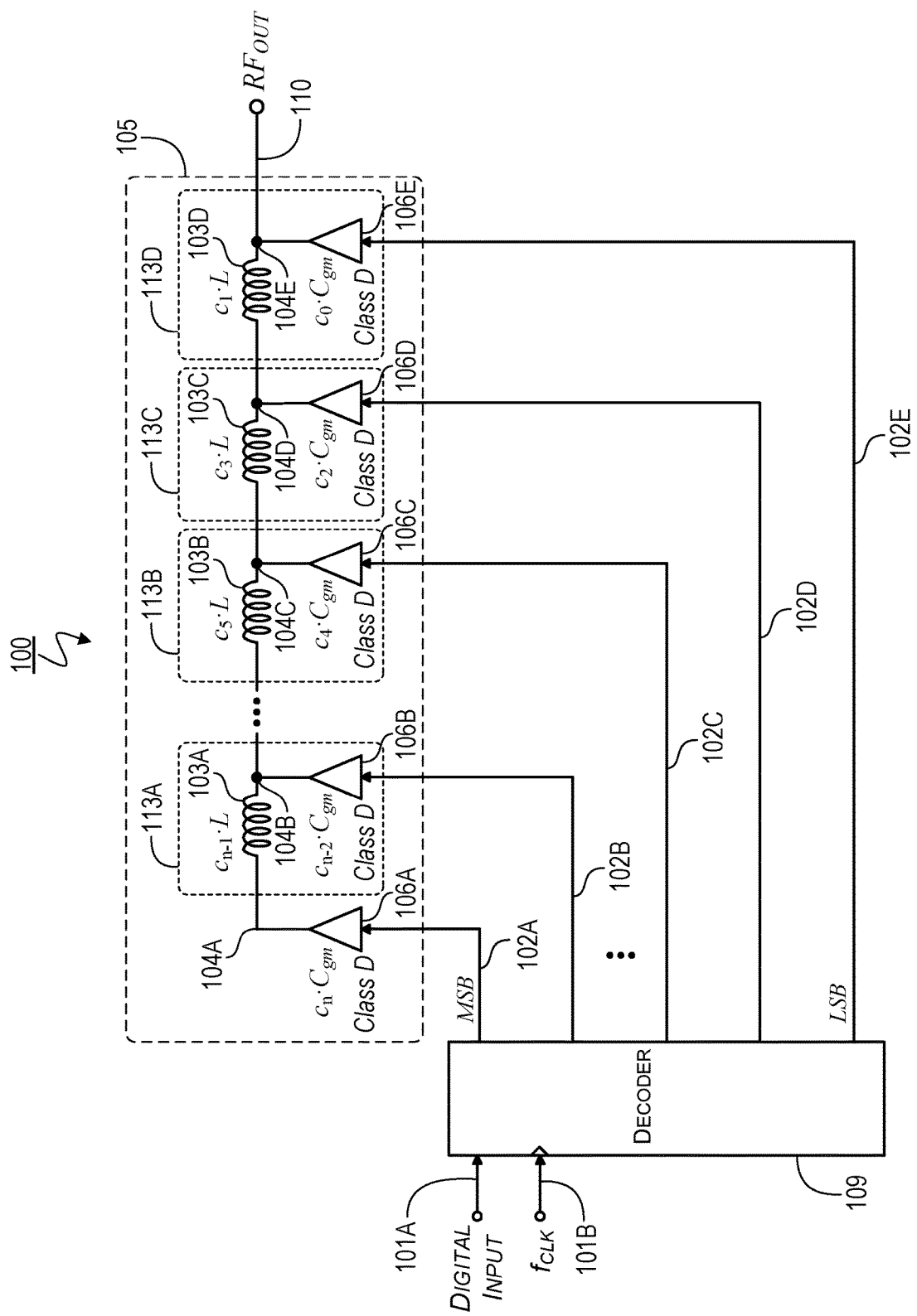
FIG. 10 is a diagram of a converter according to a representative embodiment of the invention, where n-bit binary data samples are decomposed into binary waveforms, which are then individually boosted and combined within a singly-terminated network of reactive-impedance segments.

A simplified block diagram of improved converter 100, according to certain preferred embodiments of the invention, is illustrated in FIG. 10. Converter 100 produces a high-level RF output on line 110 by separately boosting and then combining a number of binary waveforms, where each binary waveform represents a single bit of an n-bit data sample received on line 101A. In the preferred embodiment of converter 100, digital data is received as binary-encoded (e.g., n-bit) samples on line 101A, such that at the output of decoder 109, each bit of the binary-encoded sample appears on a different output line in the form of a binary waveform. In a preferred embodiment, each of the binary waveforms switches between two discrete levels at the same rate as the n-bit data sample (e.g., switches between one level corresponding to a value of digital value of 0, and a second level corresponding to a digital value of 1). In the exemplary embodiment of converter 100, the least-significant-bit (LSB) of the n-bit sample appears on line 102A, and the most-significant-bit (MSB) of the n-bit sample appears on line 102E. Other forms of digital encoding can be utilized, however, including a conventional thermometer encoding scheme. Also, in still further embodiments, decoder 109 (or a separate module prior to decoder 109) first converts the input data to a different encoding scheme prior to generating the binary waveforms. Conventionally, the digital samples on lines 102A-E would be converted to a clipped or peaked analog voltage prior to signal boosting using, for example, a Doherty amplifier (e.g., converter 40 in FIG. 4). In the preferred embodiments of converter 100, a novel conversion process is employed which instead involves: 1) decomposing digital data into a set of binary waveforms that represent individual bits (e.g., waveforms on lines 102A-E); 2) individually boosting those binary waveforms with a dedicated gain element (e.g., gain elements 106A-E); and 3) finally combining the individually boosted waveforms within a singly-terminated network of reactive-impedance segments (e.g., network 105), to produce an RF output on line 110.

In the preferred embodiments of converter 100, the digital encoding scheme reflects a binary weighting (i.e., a binary encoding) and the signal boost introduced by each of gain elements 106A-E is directly related to that binary weighting, such that the applied signal boost increases by a factor of two in progression from the least-significant gain element 106E to the most-significant gain element 106A. For binary weighting, therefore, the signal boost introduced by the most-significant gain element 106A, preferably is $2^{n-1}$ times greater than the signal boost introduced by least-significant gain element 106E, where n is the number of bits used to encode the digital sample on input line 101A. And for the case of binary weighting, the most-significant binary waveform preferably is associated with the network node having the largest capacitive reactance (e.g., network node 104A which is located furthest from output line 110). More generally, for embodiments in which other digital encoding schemes are used, each of the gain elements 106A-E included within network 105 provides a level of signal boost that corresponds to the digital encoding scheme for data input 101A. In alternate embodiments, the digital encoding scheme represents other than binary weighting (e.g., unary weighting, etc.), and the signal boost associated with each of gain elements 106A-E has a corresponding weighting.

The present inventor has discovered that this novel conversion process has several important advantages relative to conventional conversion processes. One advantage is related to the peak levels of signals involved in the conversion process. For equal RF power, the peak signal levels associated with a binary waveform can be 3 to 4 times lower than the peak signal levels associated with a representative analog waveform. The ratio of peak level to root-mean-square (RMS) level of a binary waveform is equal to 1. It is a well understood principle that amplifiers biased to boost signals with smaller peak-to-RMS ratios provide a higher fidelity for the same power-added efficiency, or provide a higher power-added efficiency for the same fidelity. Because each bit of the n-bit sample on lines 102A-E is effectively a two-valued signal, each of gain elements 106A-E is preferably biased for operation as a conventional Class D amplifier. Rather than being biased to provide a linear boost to a multi-level input signal, Class D amplifiers are active devices that, depending on the polarity of an input signal, are biased to switch between a high (positive) output state and a low (negative) output state. Unlike linear amplifiers, which can be inefficient and constantly dissipate power, Class D amplifiers only dissipate power during the very short transition (transient) period between their two output states. Consequently, Class D amplifiers provide much greater power-added efficiency than linear amplifiers. Although in the preferred embodiments of converter 100, the gain elements are biased for operation as conventional Class D amplifiers, other types of amplifiers can be utilized, at the expense of reduced power-added efficiency, such as conventional amplifiers that are biased for Class A, Class B, Class AB, and/or Class C operation.

In addition to advantages related to boosting signals with lower peak-to-RMS ratios, the present inventor has recognized that the present processing technique, which is implemented by converter 100, has advantages related to the boosting of high-speed signals, and the boosting of signals that occupy a wide range of carrier frequency bands. Decomposition of an n-bit data sample into individual binary waveforms provides a means for boosting signals using the principles of distributed amplification. Rather than boosting a signal using one or two amplifiers in parallel, and combining amplifier outputs with narrowband structures (e.g., hybrid coupling structure 22B of balanced amplifier 20 and quarter-wave transmission lines 37A&B of Doherty amplifier 30), converter 100 utilizes multiple gain elements in parallel (e.g., one gain element per encoded bit), and combines the outputs of those gain elements using wideband, reactive-impedance network 105 to produce a single, composite signal on output line 110. Another well-understood principle is that amplifiers which incorporate reactive-impedance networks, such as artificial transmission lines (e.g., artificial transmission lines 65A&B of distributed amplifier 60), have a greater capacity for boosting high-speed signals and signals that occupy a wide range of carrier frequency bands. It is also well understood, however, that conventional distributed amplifiers exhibit poor power-added efficiency. One reason for this poor efficiency is the use of reactive-impedance networks (e.g., artificial transmission lines), having termination impedances that dissipate power at both ends of the network (e.g., power dissipation in termination resistor 62B that is internal to amplifier 60, and power dissipation in the load impedance presented to amplifier 60 on output line 69). Another reason is the need to bias gain elements (e.g., amplifiers 66A&B) for linear operation, so that analog (i.e., multi-level) signals can be boosted without introducing significant distortion.

Figure 8C:
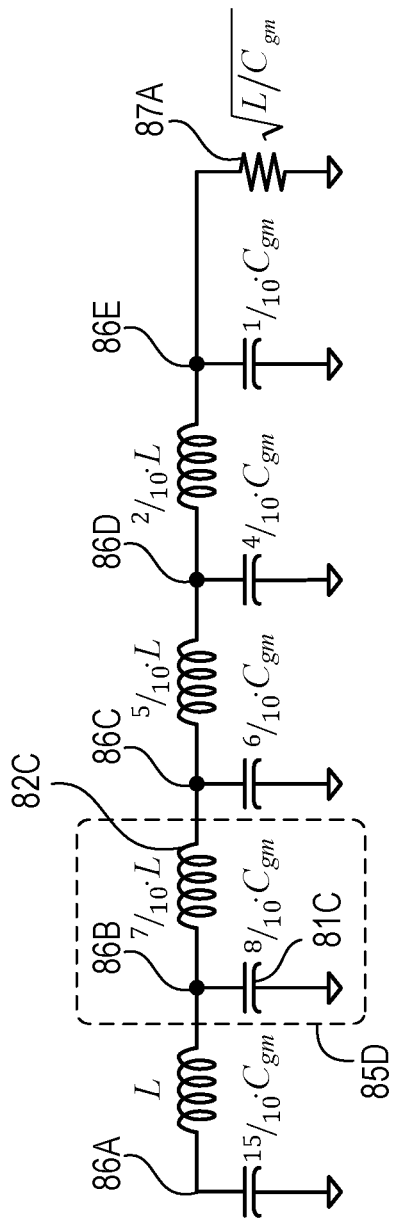
FIG. 8C is a block diagram of a conventional reactive-impedance network comprising multiple segments, with different amounts of capacitive reactance associated with each segment, and a termination impedance at one end.
Figure 8D:
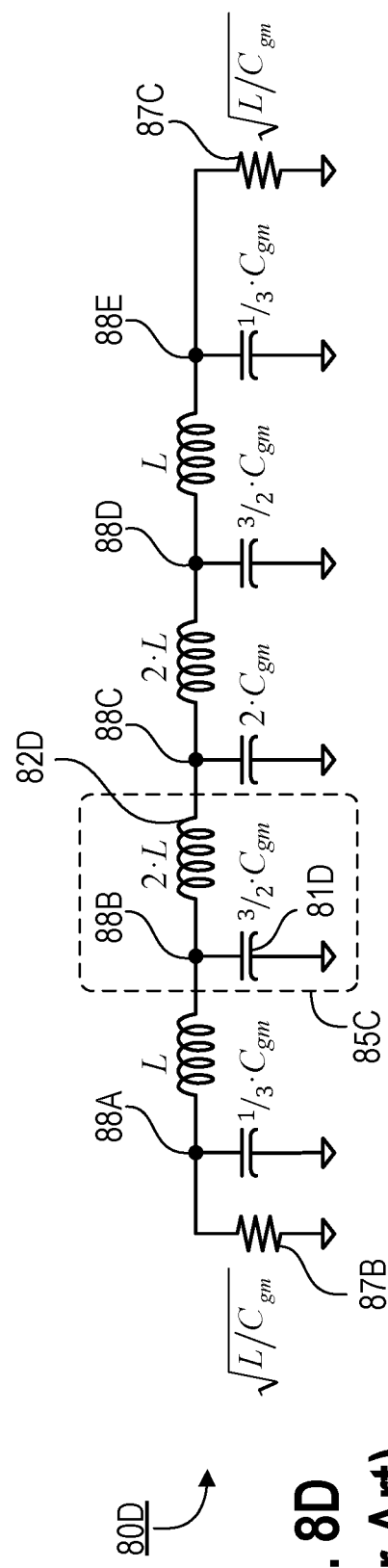
FIG. 8D is a block diagram of a reactive-impedance network comprising multiple segments, with different amounts of capacitive reactance associated with each segment, and a termination impedance at both ends.

In addition to an arrangement where gain elements can be biased for nonlinear operation (e.g., Class AB, Class C, or Class D amplification), the preferred embodiment of converter 100 overcomes the disadvantage in power-added efficiency, which is associated with conventional distributed amplifiers, by using a singly-terminated network of reactive-impedance segments to combine the binary waveforms after boosting by their respective gain elements. More specifically, singly-terminated network 105, which is utilized for signal combining by exemplary converter 100, is similar in construction to network 80C of FIG. 8C. Like network 80C, network 105 comprises a number of reactive-impedance segments, each segment having a shunt capacitive reactance (e.g., the intrinsic output capacitance of a gain element) and a series inductive reactance (e.g., a discrete inductor), but does not include a shunt resistive element on the end opposite the output line (e.g., output line 110). Compared to conventional doubly-terminated structures which dissipate power in termination resistors at both ends of a reactive-impedance network, singly-terminated structures transfer all available power to the load on the output line (i.e., power is only dissipated in the load). As a result, use of singly-terminated networks can improve power-added efficiency by a factor of two, compared to doubly-terminated network (e.g., doubly-terminated networks 80A&B of FIGS. 8A&B). For other than uniformly weighted waveforms, these singly-terminated structures have the further advantage that the capacitive reactance associated with each network node, increases progressively from the output (e.g., load) side of the network to the opposite side of the network. And since the boosting capability of a gain cell is directly related to its intrinsic input or output capacitance, the boosting capability of a gain cell can increase progressively from the load side of the network to the opposite side of the network. Consequently, the most-significant waveforms requiring the largest boost, are preferably associated with network nodes that are farthest from the load end; while the least-significant waveforms requiring the smallest boost, are preferably associated with network nodes that are closest to the load end.

Figure 11:
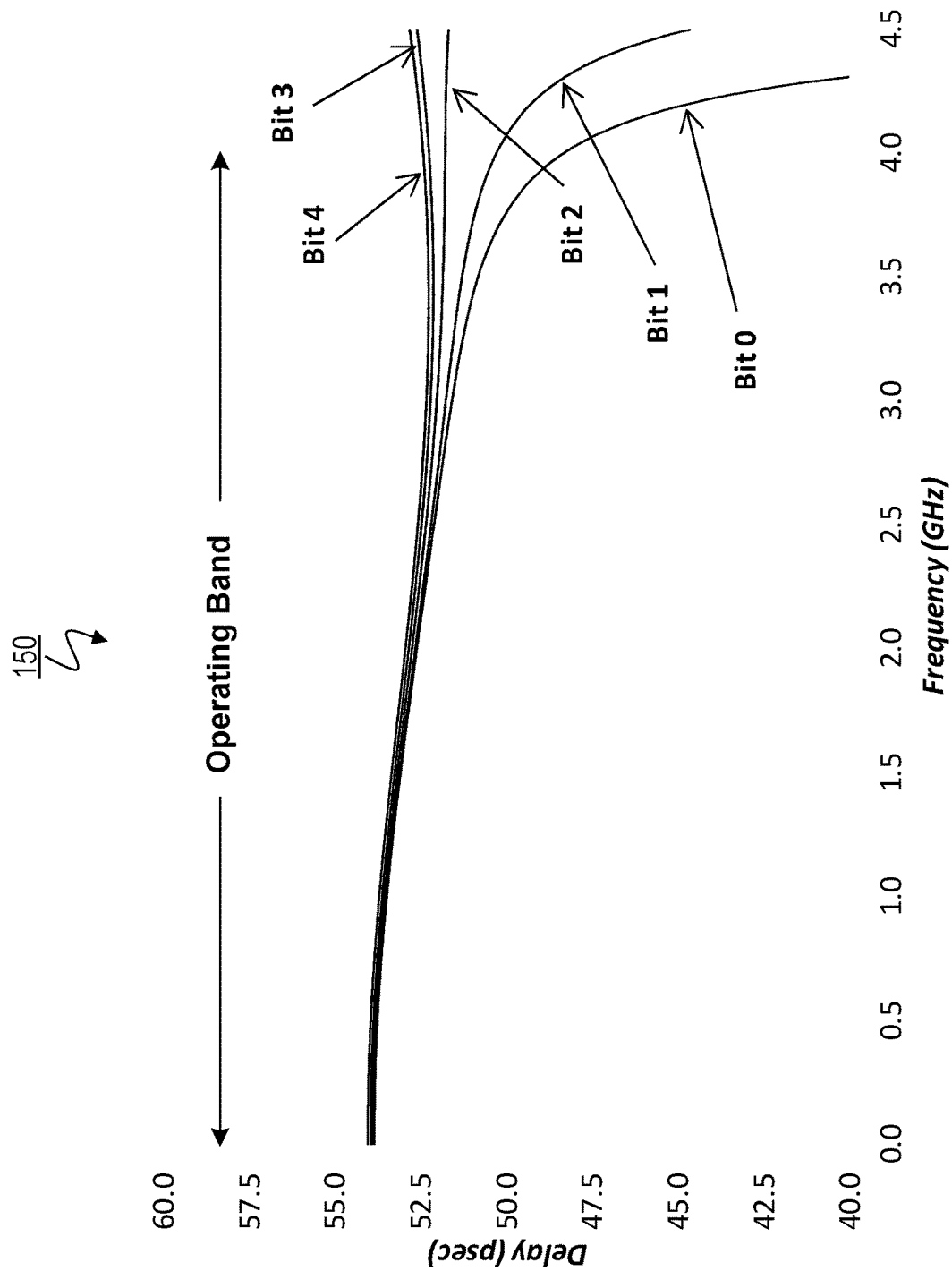
FIG. 11 is a plot of the delay introduced to signals as they propagate through a singly-terminated network of reactive-impedance segments, from the various internal nodes to the output.

In the preferred embodiments, the values of discrete inductors (e.g., inductor 82C of network 80C and inductors 103A-D of converter 100) and the values of intrinsic capacitances at the outputs of gain elements (e.g., capacitance 81C of network and the intrinsic capacitances at the outputs of gain elements 106A-E of converter 100), are selected so that within the intended operating bandwidth of converter 100: 1) the frequency response from any of nodes 104A-E to output line 110, is approximately all-pass; and 2) the signal paths from any of nodes 104A-E to output line 110, have approximately equal propagation delays, such that the signals from the various paths arrive simultaneously at output line 110. Conventional techniques can be used to construct singly-terminated networks with the above properties. Plot 150 in FIG. 11, for example, illustrates that for the selection of inductance L=800 pH and capacitance $C_{gm}$=300 fF in the construction of network 80C, the propagation delay is equal to about 55 ps from each node 86A-E to termination resistor 87A at the load, for an intended operating bandwidth in excess of 4 GHz.

Figure 12A:
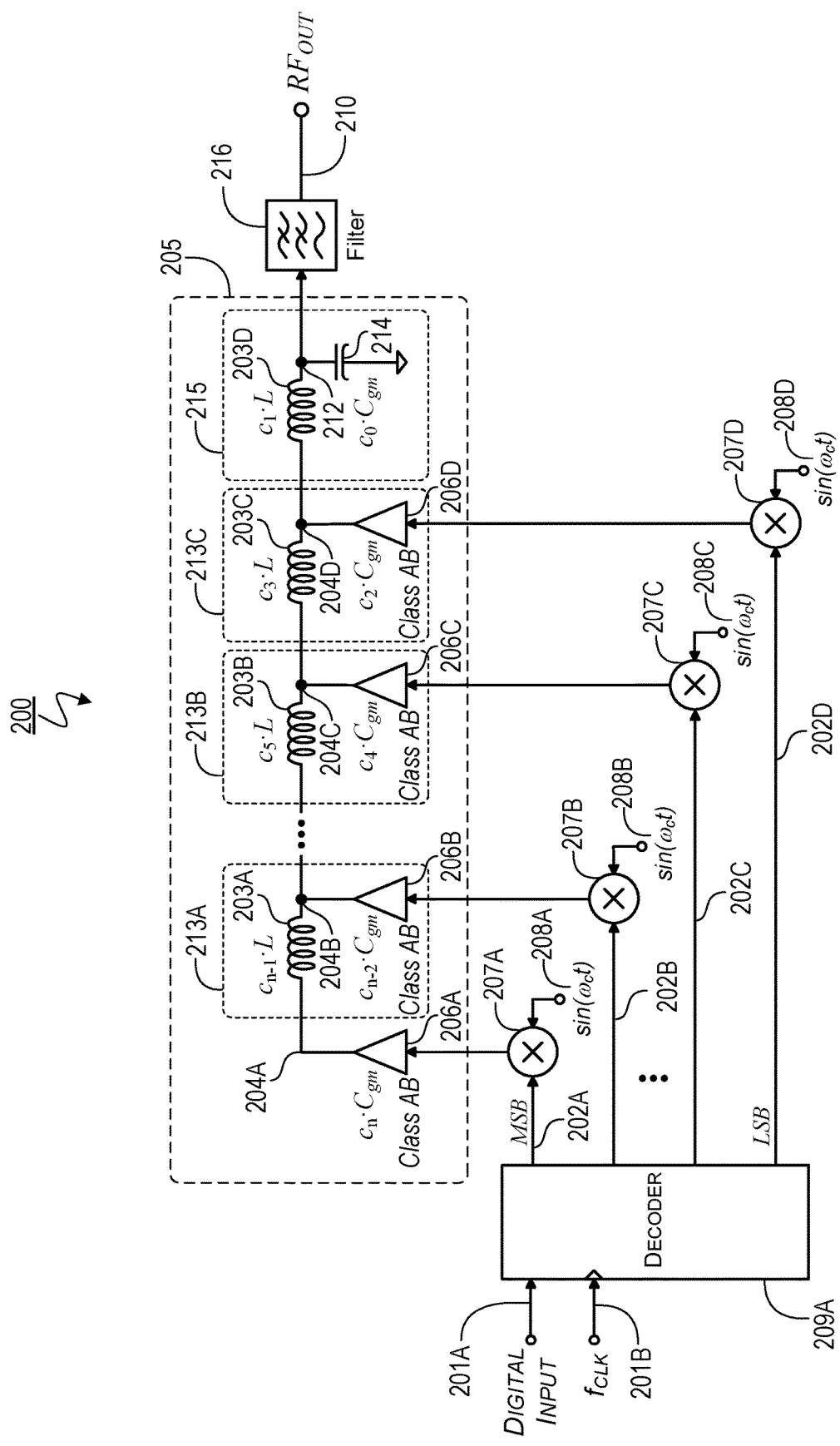
FIG. 12A is a diagram of a converter according to a representative embodiment of the invention, where n-bit binary data samples are decomposed into binary waveforms, and where in separate steps, the binary waveforms are individually modulated onto replicas of a carrier wave and individually boosted, before being combined within a singly-terminated network of reactive-impedance segments.

Converter 200, shown in FIG. 12A, is an alternative exemplary converter according to the preferred embodiments of the present invention. The functionality of exemplary converter 200 has many similarities with the functionality of exemplary converter 100. The n-bit data samples received by converter 200 on input line 201A, for example, are decomposed into multiple binary waveforms, each representing one of the n bits (e.g., waveforms on lines 202A-D). Furthermore, binary waveforms are individually boosted and combined within a singly-terminated network of reactive-impedance segments (e.g., network 205), to produce a single, composite output signal on output line 210. In the preferred embodiments, the number of binary waveforms at the output of decoder 209A is equal to the number of bits used to encode the data samples on input line 201A. As in exemplary converter 100, the level of applied boost for each gain element included within converter 200, preferably is directly related to the digital encoding scheme for the data samples on input line 201A (or to the encoding scheme with respect to the signals on the output of decoder 209A, which typically will be the same), such that each gain element boosts a signal with a weighting that corresponds to the weighting of the bit associated with that signal. Converter 200, however, differs from converter 100 in several respects. One difference is that before each decomposed waveform on lines 202A-D is boosted by its associated gain element, the waveform is separately modulated onto a replica (e.g., replicas 208A-D) of a common carrier wave, which has a frequency equal to $\omega_C$. This carrier modulation occurs within a bank of frequency-mixers (e.g., frequency-mixers 207A-D), and the number of mixers is preferably equal to the number of binary waveforms at the output of decoder 209. Conventionally, modulation onto a carrier wave and/or signal boosting of a digital sample (e.g., digital samples on lines 202A-D) would occur for example, after conversion to an analog voltage (e.g., converter 10A in FIG. 1A), or after conversion to a clipped or peaked analog voltage (e.g., converter 40 in FIG. 4). Separately modulating each bit of an n-bit sample onto a replica carrier wave according to the preferred embodiments, however, has the advantage of lower peak levels for the signals being boosted by the various gain elements. For equal RF power, the peak signal level of a carrier wave after modulation by a binary waveform, can be 2 to 3 times lower than the peak signal level of a carrier wave after modulation by a representative analog waveform. The ratio of peak level to root-mean-square (RMS) level of modulated-carriers in the preferred embodiments is equal to $\sqrt{2}$. As a consequence of these lower peak-to-RMS ratios, the gain elements utilized in converter 200 (e.g., gain elements 206A-D) can be biased for greater power-added efficiency than would be possible for conventional modulated-carriers that typically exhibit higher peak-to-RMS ratios. Preferably, the gain elements of exemplary converter 200 are biased for operation as conventional Class AB amplifiers, so that power-added efficiency is twice as high as what would be realized by gain elements that are biased for operation as conventional linear amplifiers (e.g., Class A amplifiers). Alternatively, greater power-added efficiency can be realized by biasing gain elements 206A-D for nonlinear operation (e.g., Class D amplifiers), at the expense of producing higher levels of unwanted odd-order harmonics (e.g., that must be attenuated by output filter 216).

Other differences between the exemplary embodiment of converter 100 and the exemplary embodiment of converter 200, are: 1) reactive-impedance network 205 includes a passive segment 215 in addition to multiple active segments (e.g., 213A-C in the current embodiment); and 2) the output of reactive-impedance network 205 is coupled to RF output line 210 via lowpass filter 216. Unlike the active segments of network 205 (e.g., segments 213A-C), which comprise a discrete inductor (e.g., inductors 203A-C) and the intrinsic output capacitance of a gain element (e.g., gain elements 206B-D), passive segment 215 comprises discrete inductor 203D and discrete capacitor 214. Use of passive segments can be advantageous because the boosting capability of a gain element is directly related to its intrinsic capacitance, and near the load side of the network (i.e., the output side), the capacitance value needed to construct a singly-terminated network can be too small for creating a gain element with appreciable boost. Output filter 216 is included in the preferred embodiments of converter 200 to remove unwanted odd-order harmonics and images from the RF output on line 210, which result from operating the gain elements of network 205 in other than a linear mode (e.g., operating gain elements 206A-D as conventional Class AB, Class C, or Class D amplifiers). Preferably the insertion loss of lowpass filter 216 is sufficiently small, so that power-added efficiency is not appreciably degraded.

Figures 9A, 9B, 9C, 9D:
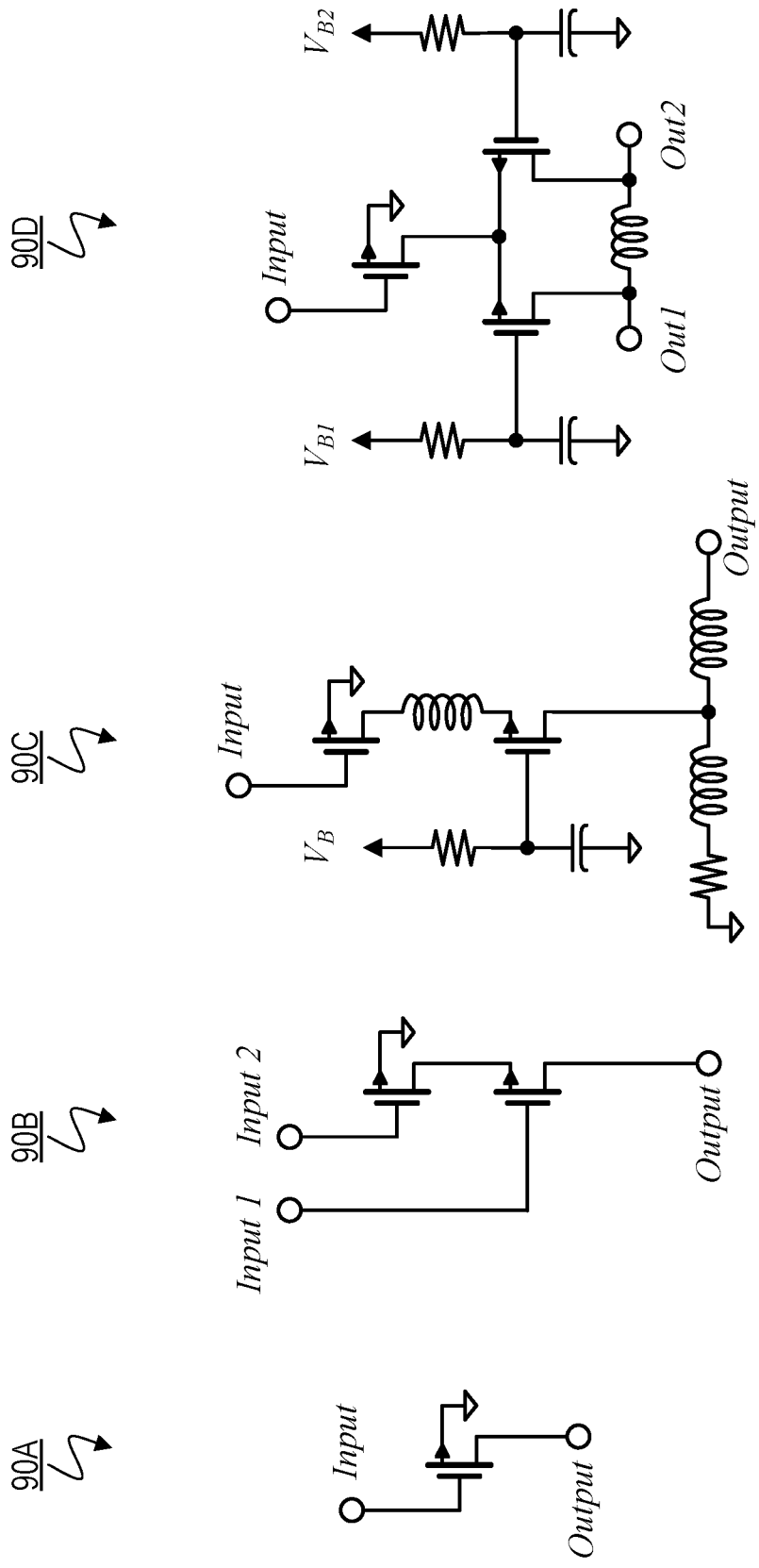
FIG. 9A is a circuit diagram of a conventional gain element comprising an active device in a common-source configuration.
FIG. 9B is a circuit diagram of a conventional gain element that mixes two inputs to produce a single output, using two active devices in a cascode configuration.
FIG. 9C is a circuit diagram of a conventional gain element comprising two active devices and reactive-impedances in a broadband cascode configuration, with gain control provided by a variable gate bias voltage.
FIG. 9D is a circuit diagram of a conventional gain element comprising three active devices and reactive-impedances, in a configuration which provides both gain control and delay control through independent gate bias voltages.
Figure 12B:
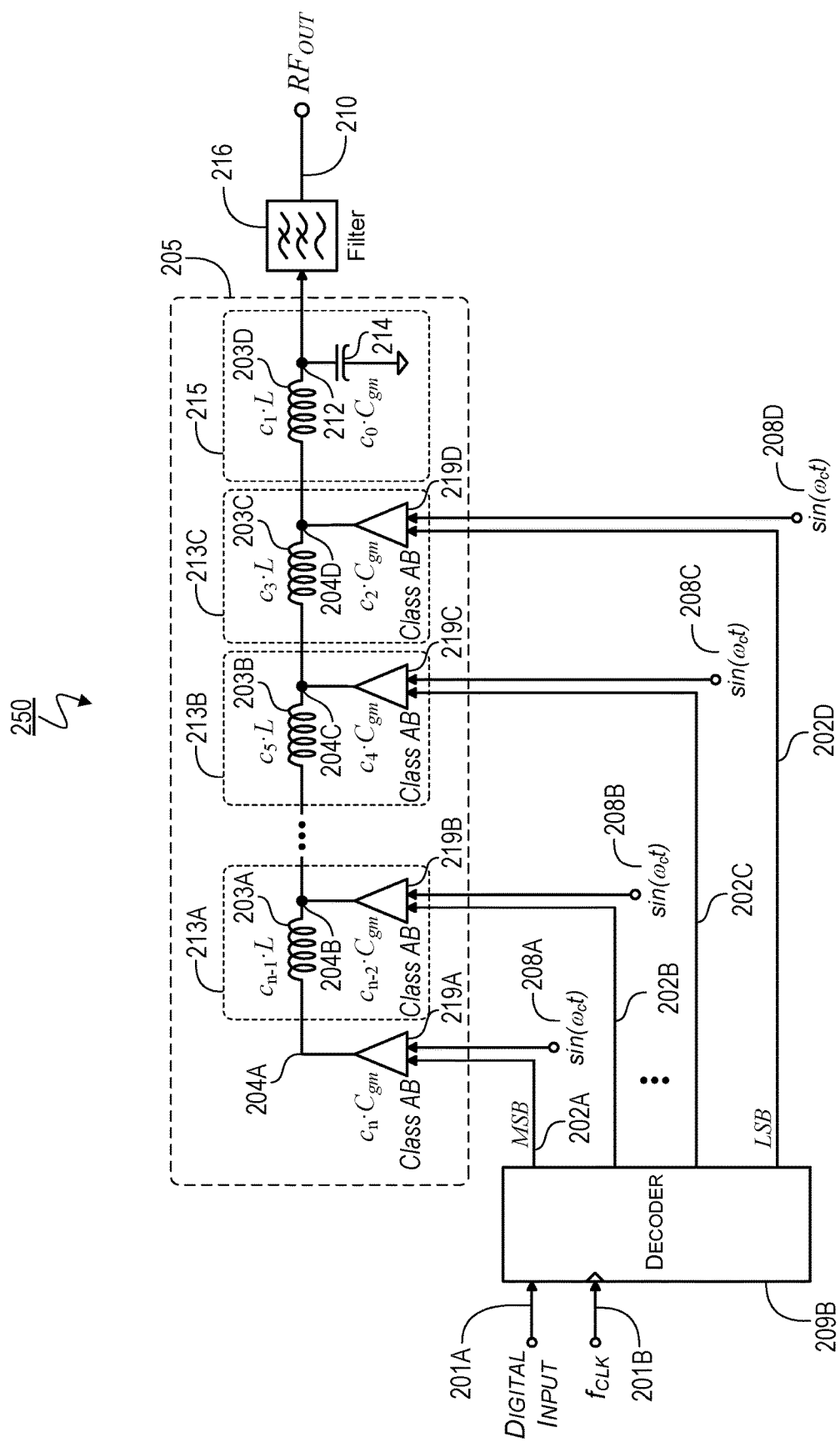
FIG. 12B is a diagram of a converter according to a representative embodiment of the invention, where n-bit binary data samples are decomposed into binary waveforms, and where in a single step, the binary waveforms are individually modulated onto replicas of a carrier wave and boosted, before being combined within a doubly-terminated network of reactive-impedance segments.

Converter 250, shown in FIG. 12B, is an alternative exemplary converter according to the preferred embodiments of the present invention, which represents a modified implementation for the functionality provided by converter 200. In representative converter 200, the component utilized for modulating binary waveforms onto replicas of a carrier wave is separate from the component utilized for boosting the modulated carrier wave. In the exemplary embodiment of converter 200, carrier waves 208A-D are modulated with frequency-mixers 207A-D, and the resulting modulated carrier waves are boosted by gain elements 206A-D. In representative converter 250, the modulation of carrier waves and the boosting of those modulated carrier waves occur within the same component. Converter 250 utilizes gain elements 219A-D, which have two input ports and a single output port, and are similar to conventional cascode amplifier 90B of FIG. 9B. Amplifiers of the type illustrated in FIG. 9B, conventionally are employed as active mixers or analog multipliers, because the output of the amplifier is equal to the product of its two inputs. In the prior art, these devices are sometimes referred to as "dual-gate" field-effect transistors (FETs). Conventional active mixers, analog multipliers, or dual-gate FETs, e.g., can be used as gain elements 219A-D, as will be well-understood by those skilled in the art.

Figure 13A:
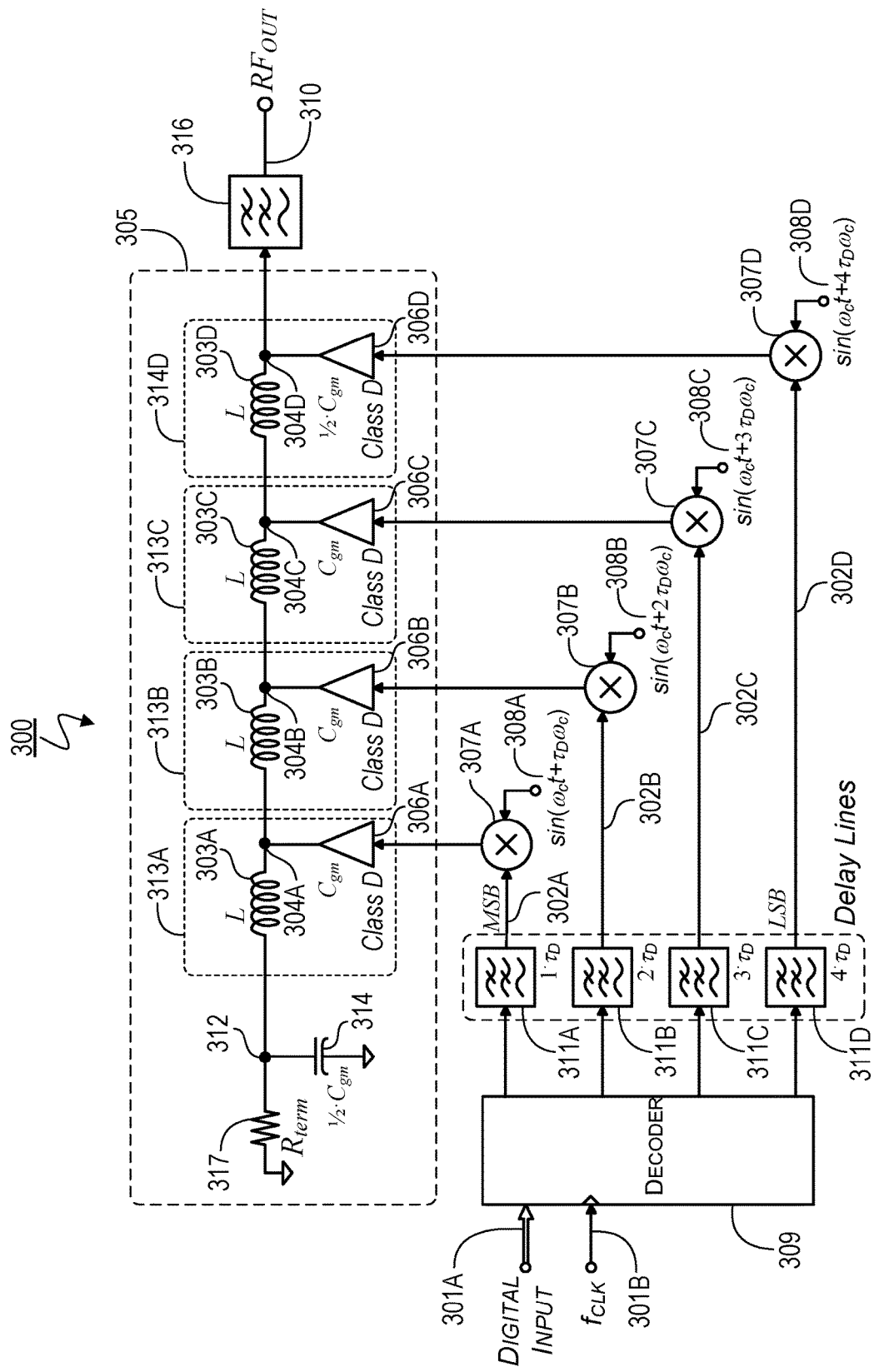
FIG. 13A is a diagram of a converter according to a representative embodiment of the invention, where n-bit binary data samples are decomposed into binary waveforms, individually delayed and modulated onto phase-shifted replicas of a carrier wave, before being individually boosted and combined within a doubly-terminated network of reactive-impedance segments.

Converter 300, shown in FIG. 13A, is another alternative exemplary converter according to the preferred embodiments of the present invention. The functionality of converter 300 is similar to that of converter 200, except that: 1) prior to modulating a carrier wave, the binary waveforms at the output of decoder 309 are shifted in time relative to each other using a bank of delay lines (e.g., delay lines 311A-D); 2) rather than being modulated onto exact replicas of a carrier wave (i.e., carrier waves having the same frequency and phase), binary waveforms 302A-D are modulated onto carrier waves 308A-D that share a common frequency, but are shifted in phase (i.e., carrier waves 308A-D are inexact replicas); and 3) after level boosting from gain elements 306A-D, modulated-carrier waveforms are combined using a doubly-terminated network. In the exemplary embodiment of converter 300, the gain elements 306A-D are biased for nonlinear operation (e.g., Class D). However, in alternate embodiments, to reduce distortion, the gain elements 306A-D are biased for more linear operation (e.g., Class AB amplification) at the expense of lower power-added efficiency. Use of doubly-terminated structures has two potential advantages over other structures, such as conventional artificial transmission lines 80A&B of FIGS. 8A&B, and singly-terminated network 80C of FIG. 8C. One potential advantage is that, compared to artificial transmission lines which comprise segments with mostly uniform capacitive reactance, the reactances of the segments comprising these doubly-terminated structures increase progressively from either of the outer nodes to the node(s) at the center of the network. This can be advantageous, e.g., in embodiments where the various binary waveforms reflect other than a uniform weighting. A second potential advantage is that, compared to singly-terminated networks, the time-delay through the various segments of a doubly-terminated, reactive-impedance network can be constant over a wider bandwidth of operation. However, use of the doubly-terminated network of converter 300, as opposed to the singly-terminated network of converter 200, means that signals do not propagate with equal delay from each of nodes 304A-D to the output on line 310. Instead, the propagation delay introduced to a signal decreases in progression from node 304A to node 304D, such that the delay introduced to signals propagating from node 304A to the output on line 310 is greater than the delay introduced to signals propagating from node 304D to the output on line 310. In the preferred embodiments of converter 300, and in a manner that compensates for the unequal time shifts occurring as modulated-carrier waves propagate though the various signal paths within doubly-terminated network 305, delay lines 311A-D introduce time shifts that are inversely related to the time shifts of the reactive-impedance network, and carrier wave replicas 308A-D are phase-shifted by an amount that is inversely related to the phase-shifts produced by the correspondingly varying time delays of the signal paths within doubly-terminated network 305. More specifically, delay lines 311A-D apply progressively longer delays to signals that are output onto lines 302A-D, and the phase-shifting applied to carrier waves 308A-D becomes progressively greater, such that the boosted signals entering nodes 304A-D, respectively, arrive on output line 310 with equal delay and phase-shift (i.e., the signals arrive at output line 310 in a coherent fashion, e.g., with a substantially constant overall delay).

Figure 13B:
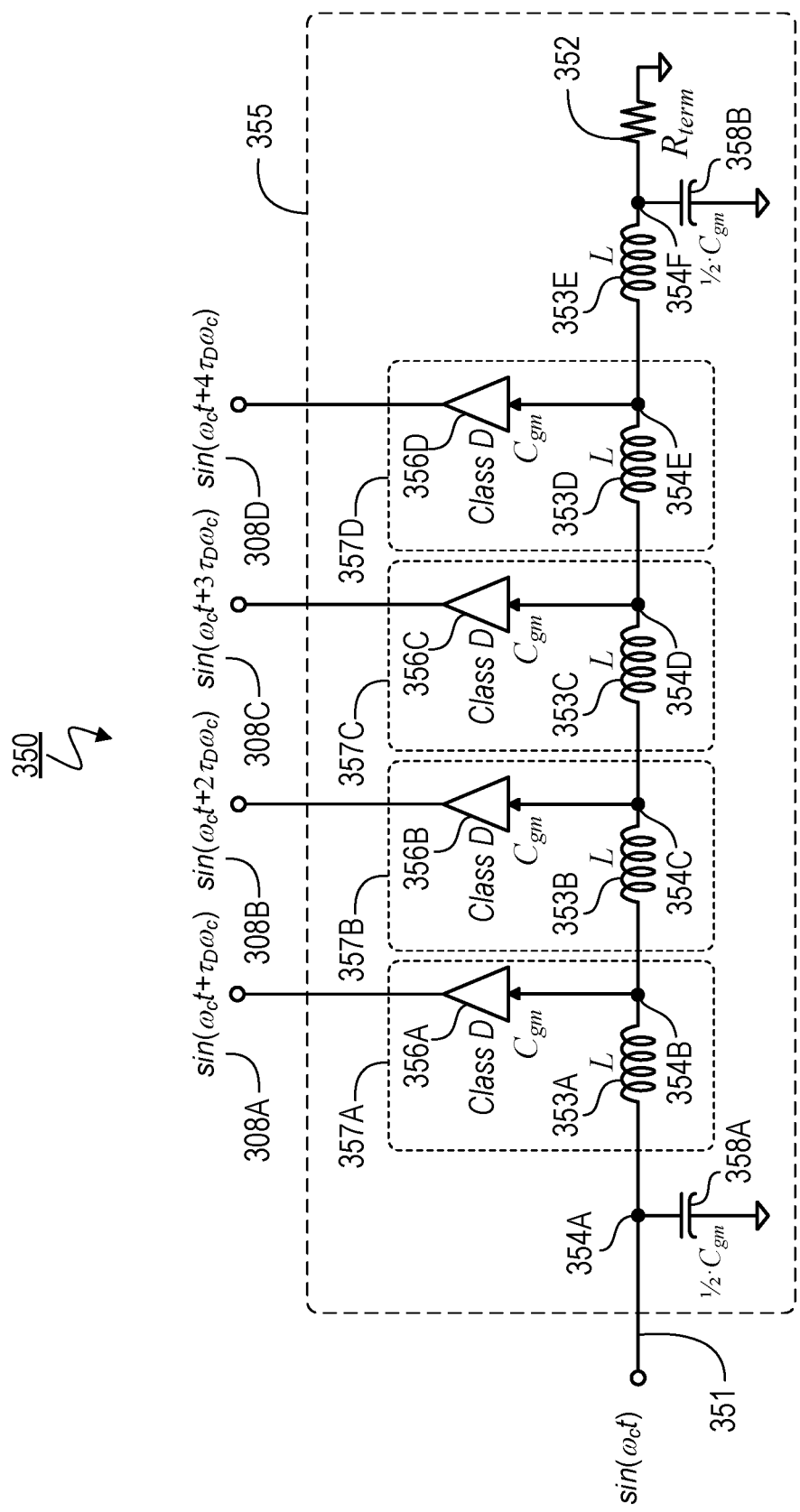
FIG. 13B is a diagram of a circuit, according to a representative embodiment of the invention, that generates phase-shifted replicas of a carrier wave using a doubly-terminated reactive-impedance network.

Phase-shifted carrier waves 308A-D, which are utilized in exemplary converter 300, can be generated with reactive-impedance networks and associated gain elements, according to preferred embodiments of the invention that are depicted by circuit 350 in FIG. 13B. In the exemplary embodiment of circuit 350, a carrier wave on line 351 is progressively delayed in time as it passes through the segments of doubly-terminated reactive-impedance network 355. It is understood by those of ordinary skill, that for a sinusoidal waveform (e.g., the waveform input on line 351), a time delay in the amount of $\tau_D$ results in a phase-shift Ø which is proportional to the frequency $\omega_c$ of the carrier wave, according to $\text{Ø} = \tau_D \cdot \omega_c$. Or conversely, a phase-shift of Ø corresponds equivalently to a time delay of $\tau_D = \text{Ø}/\omega_c$. In the preferred embodiments, each of the phase-shifted carrier waves is boosted according to a uniform weighting, and each segment of reactive-impedance network 355 introduces an equal time delay (e.g., a time delay of $\tau_D$). For these reasons, reactive-impedance network 355 preferably is a doubly-terminated structure, similar to artificial transmission lines 80A&B of FIGS. 8A&B, with equal capacitive reactances at the nodes associated with a gain element (e.g. interior nodes 354B-E that are associated with gain elements 356A-D). Other conventional structures and methods for introducing a phase-shift to a carrier wave are known in the prior art, including methods that comprise singly-terminated networks, networks with non-uniform capacitive reactances, and phase-shifters utilizing switched line, reflection, loaded line, and low-pass/high-pass techniques. These alternate structures and methods also (or instead) can be used to phase-shift carrier waves 308A-D.

Figure 14:
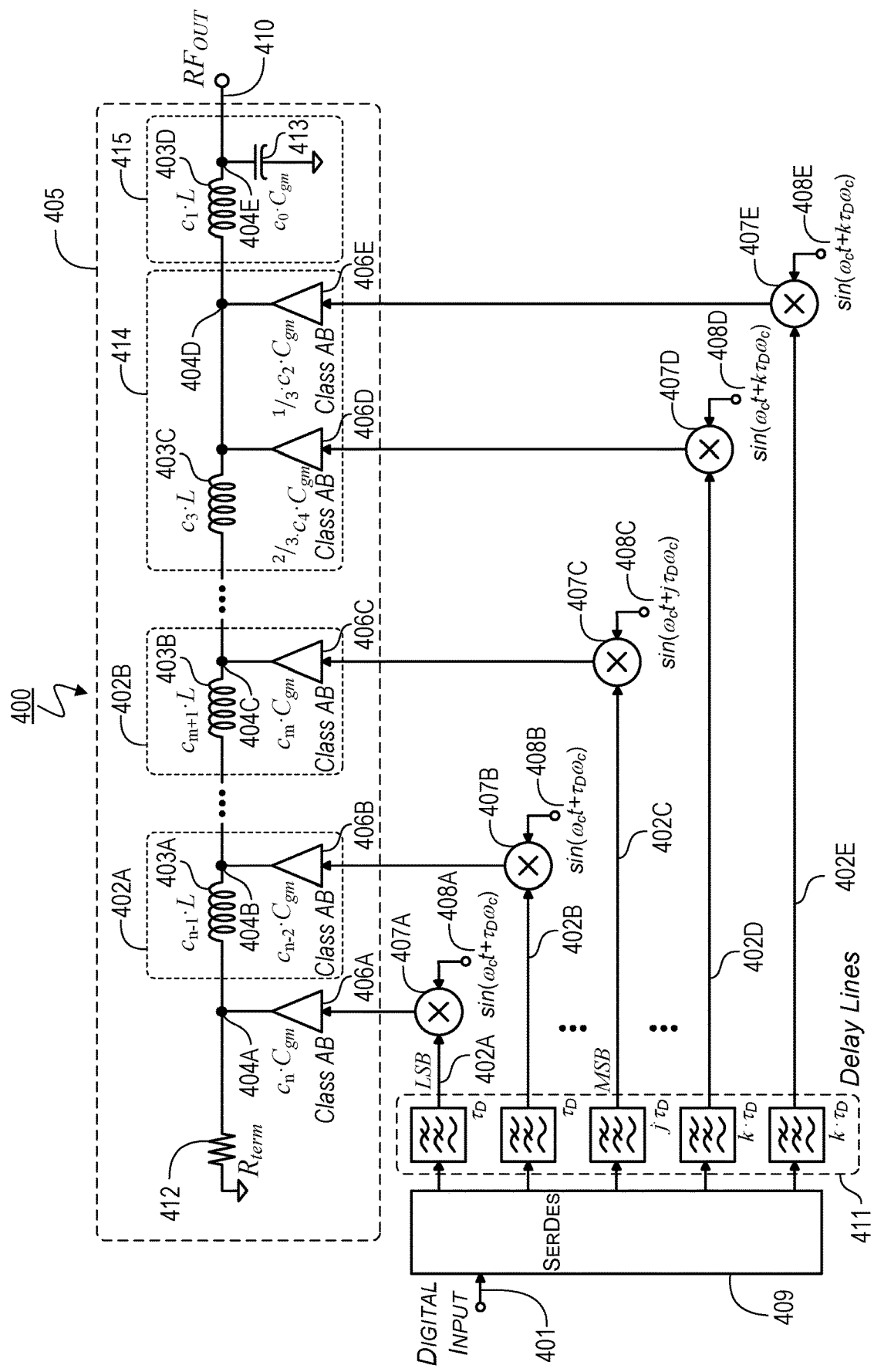
FIG. 14 is a diagram of a converter according to a representative embodiment of the invention, where n-bit binary data samples are received as a serial bit stream, decomposed into a binary waveforms, individually delayed and modulated onto phase-shifted replicas of a carrier wave, individually boosted, and then combined within a doubly-terminated network of reactive-impedance segments.

Converter 400, shown in FIG. 14, is another alternative exemplary converter according to the preferred embodiments of the present invention. The functionality of converter 400 is similar to that of converter 300, except that: 1) the input data samples on input line 401 are received as a serial bit stream, and converted to n-bit data samples using serializer-deserializer (SerDes) 409; and 2) after level boosting from gain elements 406A-E, modulated-carrier waveforms are combined using a doubly-terminated network, which is constructed from reactive-impedance segments having capacitive reactances that increase progressively from either of outer nodes 404A&E to node 406C at the center of the network. Like exemplary converter 300, exemplary converter 400 includes a reactive-impedance network (e.g., network 405) with a passive segment (e.g., passive segment 415), which has no active gain element. Passive segment 415 instead comprises discrete inductor 403D and discrete capacitor 413. Unlike exemplary converter 300, however, where a discrete capacitor (e.g., capacitor 314) is located near the terminated end of a reactive-impedance network (e.g., network 305 of converter 300), discrete capacitor 413 of converter 400, is located near the output end of reactive-impedance network 405. In the preferred embodiments of converter 400: 1) the most-significant binary waveform is associated with node 404C and is boosted by the largest amount; and 2) the least-significant binary waveform is associated with node 404A and is boosted by the smallest amount. In the exemplary embodiment of converter 400, a time-shift is introduced to binary waveforms 402A-E, and a phase-shift is introduced to carrier waves 408A-E, which compensate for the unequal delays introduced by doubly-terminated network 405, to ensure that boosted waveforms arrive at output line 410 in a coherent fashion. In the exemplary embodiment of converter 400, the gain elements are biased for quasi-linear operation (e.g., Class AB amplification). However, in alternate embodiments, to increase power-added efficiency, the gain elements are biased for nonlinear operation (e.g., Class D amplification) at the expense of greater distortion. In the exemplary embodiment of converter 400, the two carrier-modulated waveforms associated with gain elements 406D&E, are combined at single node 404D, within reactive-impedance segment 414. In embodiments where sufficient boosting can be realized with less capacitive reactance, such an arrangement can reduce the complexity (i.e., order) of the reactive-impedance network used for combining boosted waveforms.

Additional Considerations

As used herein, the term "coupled", or any other form of the word, is intended to mean either directly connected or connected through one or more other elements, such as reactive-impedance segments, passive elements, gain elements, or other processing blocks, e.g., for the purpose of preprocessing. In the drawings and/or the discussions of them, where individual modules or processing blocks are shown and/or discussed as being directly connected to each other, such connections should be understood as couplings, which may include additional steps, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein. The shunt capacitance associated with a reactive-impedance segment is intended to mean the capacitance introduced by a passive component (e.g., discrete capacitor), or by the intrinsic (parasitic) capacitance at the output of an active device.

The embodiments discussed above concern, among other things, nested sets of ladder networks, with each ladder network effecting summation of the signals that are input into it, and with outputs of earlier ladder networks coupled to the inputs of later ladder networks, so that the number of input signals are summed together using a multi-staged summation structure. As used herein, unless explicitly stated otherwise, the terms "summation", "sum" and any other forms of the word are intended to mean added together, whether on a weighted or non-weighted basis, whether the individual signals have been subject to the same or different amounts of delay prior to summation, and/or whether the individual signals are directly summed, subjected to substantially identical processing prior to summation, or are subject to different kinds of processing prior to summation. Different embodiments will employ different options in this regard (e.g., the same or different relative weightings, the same or different relative delays and/or the same or different pre-processing) to achieve different desired results, e.g., as noted above.

Where a specific value is mentioned herein, such a reference should be understood to mean that value or substantially that value, which includes values that are not substantially different from the stated value, i.e., permitting deviations that would not have substantial impact within the identified context.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof as limited solely by the claims appended hereto.

What is claimed is:

1. An apparatus for converting digital data to radio-frequency (RF) signals, said apparatus comprising:
   an input line for receiving binary-encoded data samples;
   a decoder having: an input that is coupled to the input line and a plurality of outputs which provide binary waveforms based on the data samples;
   a reactive-impedance network having an output and comprising a plurality of segments, with: (a) an input of each of said segments coupled to a different one of the outputs of the decoder, (b) each of said segments including at least one shunt capacitive reactance and at least one series inductive reactance, with the series inductive reactance implemented as a discrete element, and (c) said segments also including active devices; and
   an output line that is coupled to one end of said reactive-impedance network,
   wherein said active devices of said reactive-impedance network differently boost signals derived from said decoder outputs, based on a binary-encoding technique across said binary waveforms,
   wherein said reactive-impedance network contains a number of capacitive elements that is greater than or equal to the number of said active devices, and
   wherein signals derived from decoder outputs are combined within said reactive-impedance network to produce a single, composite signal at said output of said reactive-impedance network.

2. An apparatus according to claim 1, wherein the number of said decoder outputs is equal to the number of bits that define said binary-encoded data samples.

3. An apparatus according to claim 1, wherein said binary-encoded data samples are decoded into a number of binary waveforms that is equal to the number of bits that define said binary-encoded data samples.

4. An apparatus according to claim 1, wherein said reactive-impedance network is a singly-terminated network without any shunt resistive element.

5. An apparatus according to claim 4, wherein signals propagate with approximately equal delay from outputs of the capacitive elements of said reactive-impedance network to the output of said reactive-impedance network.

6. An apparatus according to claim 1, wherein said reactive-impedance network is a doubly-terminated network that is terminated at exactly one end with a shunt resistive element.

7. An apparatus according to claim 6, further comprising a bank of delay lines, each having an input coupled to a different one of the outputs of the decoder, and each delaying a corresponding signal by an amount that is inversely related to delay introduced to said corresponding signal by said reactive-impedance segment.

8. An apparatus according to claim 1, wherein said active devices within said reactive-impedance network boost levels of said binary waveforms.

9. An apparatus according to claim 8, wherein said active devices within said reactive-impedance network are biased to operate as Class D amplifiers.

10. An apparatus according to claim 1, wherein said active devices within said reactive-impedance network boost levels of modulated-carrier waves.

11. An apparatus according to claim 10, wherein said active devices within said reactive-impedance network are biased to operate as Class AB amplifiers.

12. An apparatus according to claim 11, further comprising a lowpass filter that attenuates unwanted harmonics and signal images generated by said active devices.

13. An apparatus according to claim 10, wherein said active devices within said reactive-impedance network are biased to operate as Class D amplifiers.

14. An apparatus according to claim 10, wherein said modulated-carrier waves are generated by modulating replicas of a common carrier wave with separate binary waveforms using a bank of frequency-mixers.

15. An apparatus according to claim 10, wherein plural of said modulated-carrier waves are generated by modulating a replica of a common carrier wave with separate binary waveforms, with said modulating occurring within the active devices used to boost said modulated-carrier waves.

16. An apparatus according to claim 10, wherein at least one of said modulated-carrier waves is generated by modulating a carrier wave with a separate binary waveform, after phase-shifting said at least one carrier wave by an amount that is inversely related to delay introduced to a corresponding signal by said reactive-impedance segment.

17. An apparatus according to claim 1, wherein said reactive-impedance network includes at least one discrete capacitor.

18. An apparatus according to claim 1, wherein said reactive-impedance network includes a segment having plural active devices.

19. An apparatus according to claim 1, wherein said at least one shunt capacitive reactance in at least one of said segments comprises one of said active devices.

20. An apparatus according to claim 1, wherein said segments are arranged in series, so that an output of one of said segments is coupled to a second input of another of said segments.

* * * * *

UNITED STATES PATENT AND TRADEMARK OFFICE
CERTIFICATE OF CORRECTION

PATENT NO. : 11,949,386 B2
APPLICATION NO. : 17/443473
DATED : April 2, 2024
INVENTOR(S) : Christopher Pagnanelli It is certified that error appears in the above-identified patent and that said Letters Patent is hereby corrected as shown below:

In the Specification

Column 3, Line 11: change "y m" to --$y_m$--

Column 3, Line 12: change "y p" to --$y_p$--

Column 3, Line 36: change "transmission line and" to --transmission line 65A, and--

Column 3, Line 37: change "from second artificial transmission line" to --from second artificial transmission line 65B.--

Column 5, Line 1: change "Circuit employs" to --Circuit 80A employs--

Column 5, Line 21: change "interior nodes of networks are equal" to --interior nodes of networks 80A&B are equal--

Column 5, Line 40: change "$\sqrt{L/C_{gm}}$. In the singly-terminated network the" to --$\sqrt{L/C_{gm}}$). In the singly-terminated network 80C, the--

Signed and Sealed this
Twenty-first Day of May, 2024

Katherine Kelly Vidal
*Director of the United States Patent and Trademark Office*